(12) United States Patent
Embleton et al.

(10) Patent No.: US 11,378,608 B2
(45) Date of Patent: Jul. 5, 2022

(54) SYSTEM AND METHOD FOR DEVICE STATE DETERMINATION

(71) Applicant: Dell Products L.P., Hopkinton, MA (US)

(72) Inventors: Steven Embleton, Austin, TX (US); Ben John Sy, Austin, TX (US); Eric Michael Tunks, Austin, TX (US)

(73) Assignee: Dell Products L.P., Massachusetts, MA (US)

( * ) Notice: Subject to any disclaimer, the term of this patent is extended or adjusted under 35 U.S.C. 154(b) by 534 days.

(21) Appl. No.: 16/516,317

(22) Filed: Jul. 19, 2019

(65) Prior Publication Data
US 2021/0018549 A1    Jan. 21, 2021

(51) Int. Cl.
*G01R 31/00* (2006.01)
*H05K 7/14* (2006.01)
*H05K 9/00* (2006.01)
*H05K 7/20* (2006.01)

(52) U.S. Cl.
CPC ......... *G01R 31/002* (2013.01); *H05K 7/1487* (2013.01); *H05K 9/0041* (2013.01); *H05K 9/0069* (2013.01); *H05K 7/20136* (2013.01)

(58) Field of Classification Search
CPC ...... G01R 31/002; G01R 1/18; H05K 7/1487; H05K 9/0041; H05K 9/0069; H05K 7/20136; H05K 7/1498; H05K 9/0062; G06F 1/182
USPC ................................................... 324/750.27
See application file for complete search history.

(56) References Cited

U.S. PATENT DOCUMENTS

| 4,785,136 A | 11/1988 | Mollet et al. |
| 4,858,309 A | 8/1989 | Korsunsky et al. |
| 4,871,220 A | 10/1989 | Kohin |
| 5,049,701 A | 9/1991 | Vowles et al. |

(Continued)

OTHER PUBLICATIONS

Gary Fenical; "Rule-of-Thumb for Calculating Aperture Size"; Laird Technologies; Mar. 2003 (http://cdn.lairdtech.com/home/brandworld/files/EMI%20Rule-of-Thumb%20for%20Calculating%20Aperture%20Size%20Technical%20Note%20Download.pdf).

(Continued)

*Primary Examiner* — Tung X Nguyen
*Assistant Examiner* — Robert P Alejnikov, Jr.
(74) *Attorney, Agent, or Firm* — Chamberlain, Hrdlicka, White, Williams, & Aughtry

(57) ABSTRACT

A data processing device includes an internal volume for housing devices and an isolation test system. The isolation test system makes a determination that an electromagnetic interference suppression state of the data processing device is to be determined; in response to the determination: suppresses generation of electromagnetic radiation by the devices; while the generation of the electromagnetic radiation by the devices is suppressed: identifies a quantity of second electromagnetic radiation that propagated through a boundary of the internal volume; makes a second determination, based at least in part on the quantity, that the electromagnetic interference suppression state of the data processing device is an electromagnetic interference suppression compromised state; and initiates performance of an action set to remediate the electromagnetic interference suppression compromised state of the data processing device based on the second determination.

20 Claims, 14 Drawing Sheets

(56) References Cited

U.S. PATENT DOCUMENTS

| | | | |
|---|---|---|---|
| 5,084,802 A | 1/1992 | Nguyenngoc | |
| 5,250,752 A | 10/1993 | Cutright | |
| 5,294,748 A | 3/1994 | Schwenk et al. | |
| 5,323,298 A | 6/1994 | Shatas et al. | |
| 5,343,713 A * | 9/1994 | Okabe | G10K 11/17881 |
| | | | 381/71.11 |
| 5,437,560 A | 8/1995 | Mizuguchi | |
| 5,498,968 A * | 3/1996 | Kjebon | H05K 9/0069 |
| | | | 324/95 |
| 5,545,844 A | 8/1996 | Plummer, III et al. | |
| 5,545,845 A | 8/1996 | Flores | |
| 5,649,831 A | 7/1997 | Townsend | |
| 5,762,513 A | 6/1998 | Stine | |
| 5,812,370 A | 9/1998 | Moore et al. | |
| 5,943,218 A | 8/1999 | Liu | |
| 6,011,221 A | 1/2000 | Lecinski et al. | |
| 6,038,130 A | 3/2000 | Boeck et al. | |
| 6,045,385 A | 4/2000 | Kane | |
| 6,068,009 A | 5/2000 | Paes et al. | |
| 6,087,826 A * | 7/2000 | Donath | B60T 8/171 |
| | | | 324/613 |
| 6,176,727 B1 | 1/2001 | Liu et al. | |
| 6,208,514 B1 | 3/2001 | Stark et al. | |
| 6,225,554 B1 | 5/2001 | Trehan et al. | |
| 6,242,690 B1 | 6/2001 | Glover | |
| 6,269,001 B1 | 7/2001 | Matteson et al. | |
| 6,331,940 B1 | 12/2001 | Lin | |
| 6,332,792 B1 | 12/2001 | Lin et al. | |
| 6,370,036 B1 | 4/2002 | Boe | |
| 6,377,451 B1 | 4/2002 | Furuya | |
| 6,437,987 B1 | 8/2002 | Lin | |
| 6,517,369 B1 | 2/2003 | Butterbaugh et al. | |
| 6,613,977 B1 | 9/2003 | Fowler | |
| 6,657,214 B1 | 12/2003 | Foegelle et al. | |
| 6,695,630 B1 | 2/2004 | Ku | |
| 6,870,092 B2 | 3/2005 | Lambert et al. | |
| 6,947,290 B2 | 9/2005 | Hirata | |
| 7,035,087 B2 | 4/2006 | Tan | |
| 7,075,796 B1 | 7/2006 | Pritchett | |
| 7,133,296 B2 | 11/2006 | Choi et al. | |
| 7,287,996 B1 | 10/2007 | Shing | |
| 7,371,097 B1 | 5/2008 | Pennypacker et al. | |
| 7,371,977 B1 | 5/2008 | Preonas | |
| 7,692,934 B2 | 4/2010 | Bartscher et al. | |
| 7,695,313 B2 | 4/2010 | Karim et al. | |
| 7,757,847 B2 | 7/2010 | Tang et al. | |
| 8,059,414 B2 | 11/2011 | Wei | |
| 8,098,492 B2 | 1/2012 | Rosenberg et al. | |
| 8,243,469 B2 | 8/2012 | Jaze et al. | |
| 8,310,834 B2 | 11/2012 | Fürholzer | |
| 8,508,956 B2 | 8/2013 | Nicol | |
| 8,530,756 B1 | 9/2013 | Winch | |
| 8,636,526 B2 | 1/2014 | Funamura et al. | |
| 8,642,900 B2 | 2/2014 | Nordling et al. | |
| 8,662,295 B2 | 3/2014 | Kubota et al. | |
| 8,687,374 B2 | 4/2014 | Watanabe et al. | |
| 8,720,682 B2 | 5/2014 | Navon et al. | |
| 8,760,859 B2 | 6/2014 | Fuchs et al. | |
| 8,969,738 B2 | 3/2015 | Ross | |
| 9,019,711 B2 | 4/2015 | Tamura | |
| 9,095,045 B2 | 7/2015 | Rojo et al. | |
| 9,370,132 B2 | 6/2016 | Coppola | |
| 9,497,894 B1 | 11/2016 | Ramsey | |
| 9,549,480 B1 | 1/2017 | Besterman | |
| 9,585,270 B2 | 2/2017 | Yang et al. | |
| 9,603,280 B2 | 3/2017 | Frank et al. | |
| 9,607,660 B2 | 3/2017 | Bennett, II et al. | |
| 9,640,910 B1 | 5/2017 | Chien et al. | |
| 9,642,290 B2 | 5/2017 | Anderson et al. | |
| 9,696,410 B1 * | 7/2017 | Lee | G01S 13/882 |
| 9,820,404 B1 | 11/2017 | Wu et al. | |
| 9,829,939 B1 | 11/2017 | Lien et al. | |
| 9,930,816 B2 | 3/2018 | Winch et al. | |
| 10,007,309 B1 | 6/2018 | Imwalle | |
| 10,249,984 B1 | 4/2019 | Rask | |
| 10,364,031 B2 | 7/2019 | Goupil | |
| 10,420,258 B1 | 9/2019 | Rahilly et al. | |
| 10,477,740 B2 | 11/2019 | Coppola | |
| 10,477,741 B1 | 11/2019 | Bae et al. | |
| 10,492,324 B2 | 11/2019 | Miura | |
| 10,520,532 B2 | 12/2019 | Lee | |
| 10,541,519 B1 | 1/2020 | Wavering | |
| 10,542,642 B2 | 1/2020 | Babhadiashar et al. | |
| 10,575,443 B2 | 2/2020 | Woodbury, II et al. | |
| 10,638,634 B1 | 4/2020 | Elsasser | |
| 10,707,636 B2 | 7/2020 | Yamamoto | |
| 10,720,722 B2 | 7/2020 | Tsorng et al. | |
| 10,734,763 B2 | 8/2020 | M R et al. | |
| 10,980,159 B2 | 4/2021 | Embleton et al. | |
| 2002/0000645 A1 | 1/2002 | Sato et al. | |
| 2002/0001181 A1 | 1/2002 | Kondo | |
| 2002/0027769 A1 | 3/2002 | Kasahara et al. | |
| 2002/0064035 A1 | 5/2002 | Mair et al. | |
| 2003/0011988 A1 | 1/2003 | Irmer | |
| 2003/0057131 A1 | 3/2003 | Diaferia | |
| 2003/0137811 A1 | 7/2003 | Ling et al. | |
| 2003/0174474 A1 | 9/2003 | Mair et al. | |
| 2003/0174487 A1 | 9/2003 | Garmong | |
| 2005/0247471 A1 | 11/2005 | Archambeault | |
| 2006/0025010 A1 | 2/2006 | Spitaels et al. | |
| 2007/0105445 A1 | 5/2007 | Manto et al. | |
| 2007/0145699 A1 | 6/2007 | Robbins | |
| 2007/0147013 A1 | 6/2007 | Robbins | |
| 2007/0151779 A1 | 7/2007 | Robbins | |
| 2008/0076291 A1 | 3/2008 | Ewing et al. | |
| 2009/0021925 A1 | 1/2009 | Heimann | |
| 2009/0095523 A1 | 4/2009 | Stevenson | |
| 2009/0146862 A1 | 6/2009 | Malone | |
| 2010/0117579 A1 | 5/2010 | Culbert | |
| 2010/0208433 A1 | 8/2010 | Heimann et al. | |
| 2010/0270299 A1 | 10/2010 | Baltussen | |
| 2010/0285636 A1 | 11/2010 | Chen | |
| 2010/0319981 A1 | 12/2010 | Kapusta et al. | |
| 2011/0011760 A1 | 1/2011 | Habersetzer | |
| 2011/0198245 A1 | 8/2011 | Soufan | |
| 2011/0222249 A1 | 9/2011 | Ruehl et al. | |
| 2011/0232956 A1 | 9/2011 | Ramsey | |
| 2012/0011700 A1 | 1/2012 | Kelaher et al. | |
| 2012/0044653 A1 | 2/2012 | Morris et al. | |
| 2012/0073873 A1 | 3/2012 | Nash | |
| 2012/0116590 A1 | 5/2012 | Florez-larrahondo | |
| 2012/0178364 A1 | 7/2012 | Dobyns | |
| 2012/0285738 A1 | 11/2012 | Cochrane et al. | |
| 2013/0032310 A1 | 2/2013 | Jaena et al. | |
| 2013/0160563 A1 | 6/2013 | Dingler et al. | |
| 2013/0194772 A1 | 8/2013 | Rojo et al. | |
| 2013/0206470 A1 | 8/2013 | Davis | |
| 2013/0258582 A1 | 10/2013 | Shelnutt | |
| 2013/0277520 A1 | 10/2013 | Funk et al. | |
| 2014/0008119 A1 | 1/2014 | Brandt | |
| 2014/0138388 A1 | 5/2014 | Synnestvedt | |
| 2014/0368821 A1 | 12/2014 | Gazaway et al. | |
| 2015/0014912 A1 | 1/2015 | Ivey et al. | |
| 2015/0245529 A1 | 8/2015 | Tam et al. | |
| 2015/0257310 A1 | 9/2015 | Desouza | |
| 2015/0271959 A1 | 9/2015 | Chen et al. | |
| 2015/0368423 A1 | 12/2015 | Yamauchi et al. | |
| 2015/0373869 A1 | 12/2015 | Macerini et al. | |
| 2016/0081231 A1 | 3/2016 | Berke | |
| 2016/0098561 A1 * | 4/2016 | Keller | G06F 21/566 |
| | | | 726/24 |
| 2016/0111814 A1 | 4/2016 | Hirano et al. | |
| 2016/0159480 A1 | 6/2016 | Barth | |
| 2016/0182130 A1 | 6/2016 | Ahmed et al. | |
| 2016/0372948 A1 | 12/2016 | Kvols | |
| 2016/0381818 A1 | 12/2016 | Mills et al. | |
| 2017/0347496 A1 | 11/2017 | Smith | |
| 2018/0062287 A1 | 3/2018 | Shaw et al. | |
| 2018/0257334 A1 | 9/2018 | Motoyanagi et al. | |
| 2019/0008079 A1 * | 1/2019 | Kondo | H05K 9/0026 |
| 2019/0050030 A1 | 2/2019 | Baum | |
| 2019/0056439 A1 | 2/2019 | Lee | |
| 2019/0159371 A1 | 5/2019 | Grinsteinner | |
| 2019/0230828 A1 | 7/2019 | Murch | |

(56) References Cited

U.S. PATENT DOCUMENTS

| | | |
|---|---|---|
| 2019/0304922 A1 | 10/2019 | Maruthamuthu et al. |
| 2019/0320796 A1 | 10/2019 | Ding |
| 2019/0353356 A1 | 11/2019 | Fischer |
| 2019/0364701 A1 | 11/2019 | Rahilly et al. |
| 2019/0379183 A1 | 12/2019 | Winsor |
| 2020/0187394 A1 | 6/2020 | Murugesan |
| 2020/0187578 A1 | 6/2020 | Sadato |
| 2020/0313584 A1 | 10/2020 | Morel et al. |
| 2021/0022277 A1* | 1/2021 | Embleton ............ H05K 7/1489 |

OTHER PUBLICATIONS

"Full HD Endoscopes"; joimax® GmbH, May 1, 2019; https://web.archive.org/web/20190501003355/https://www.joimax.com/en/products/electronic-devices/hd_endoscopes/.

"JRE 0814 RF Shielded Test Enclosure"; JRE Test, LLC, Apr. 22, 2019; https://web.archive.org/web/20190422094016/https://jretest.com/product/jre-0814/.

"Tapster"; Tapster Robotics, Inc., Sep. 30, 2017; https://web.archive.org/web/20170930111059/https://www.tapster.io/.

* cited by examiner

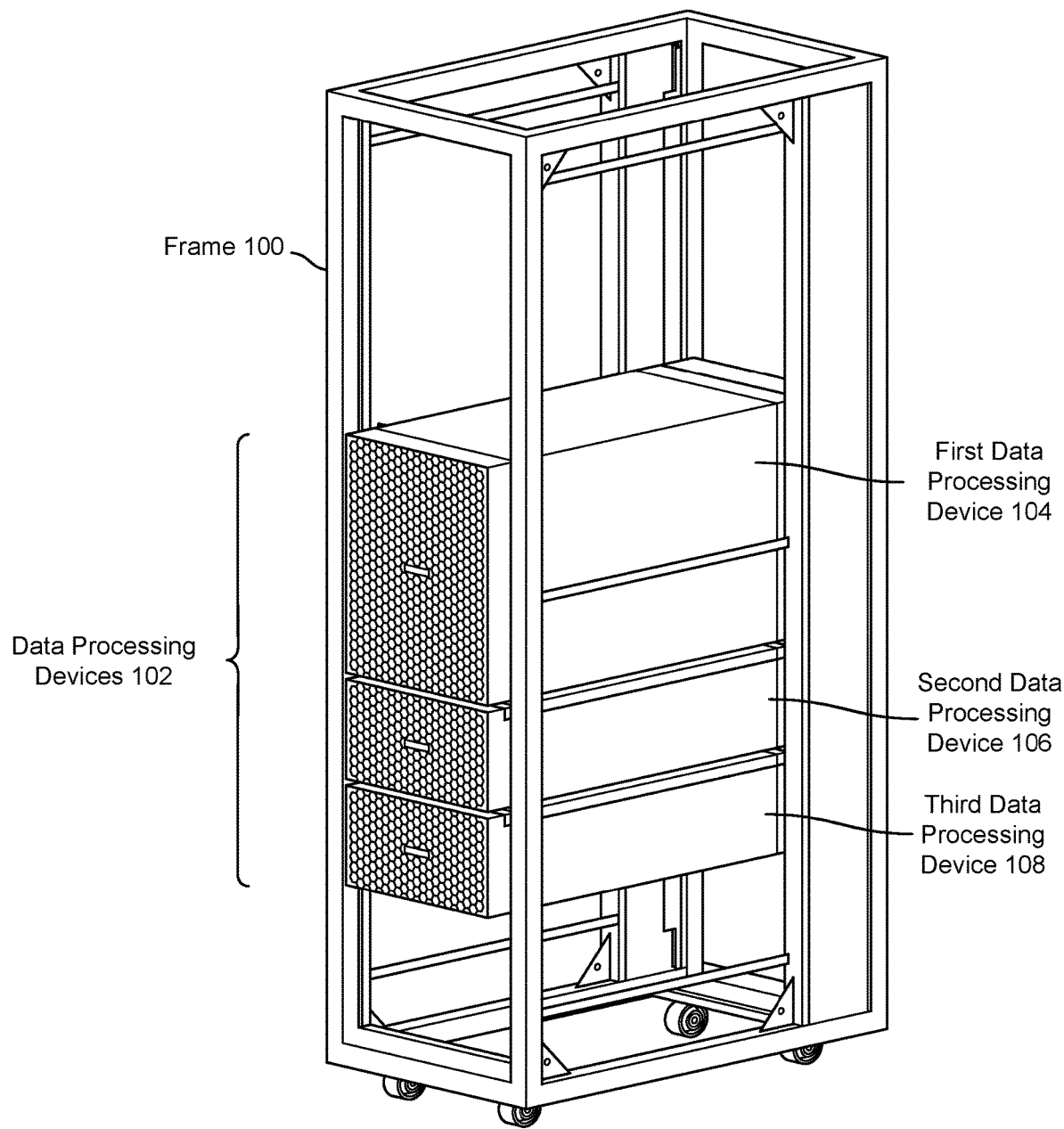
FIG. 1.1

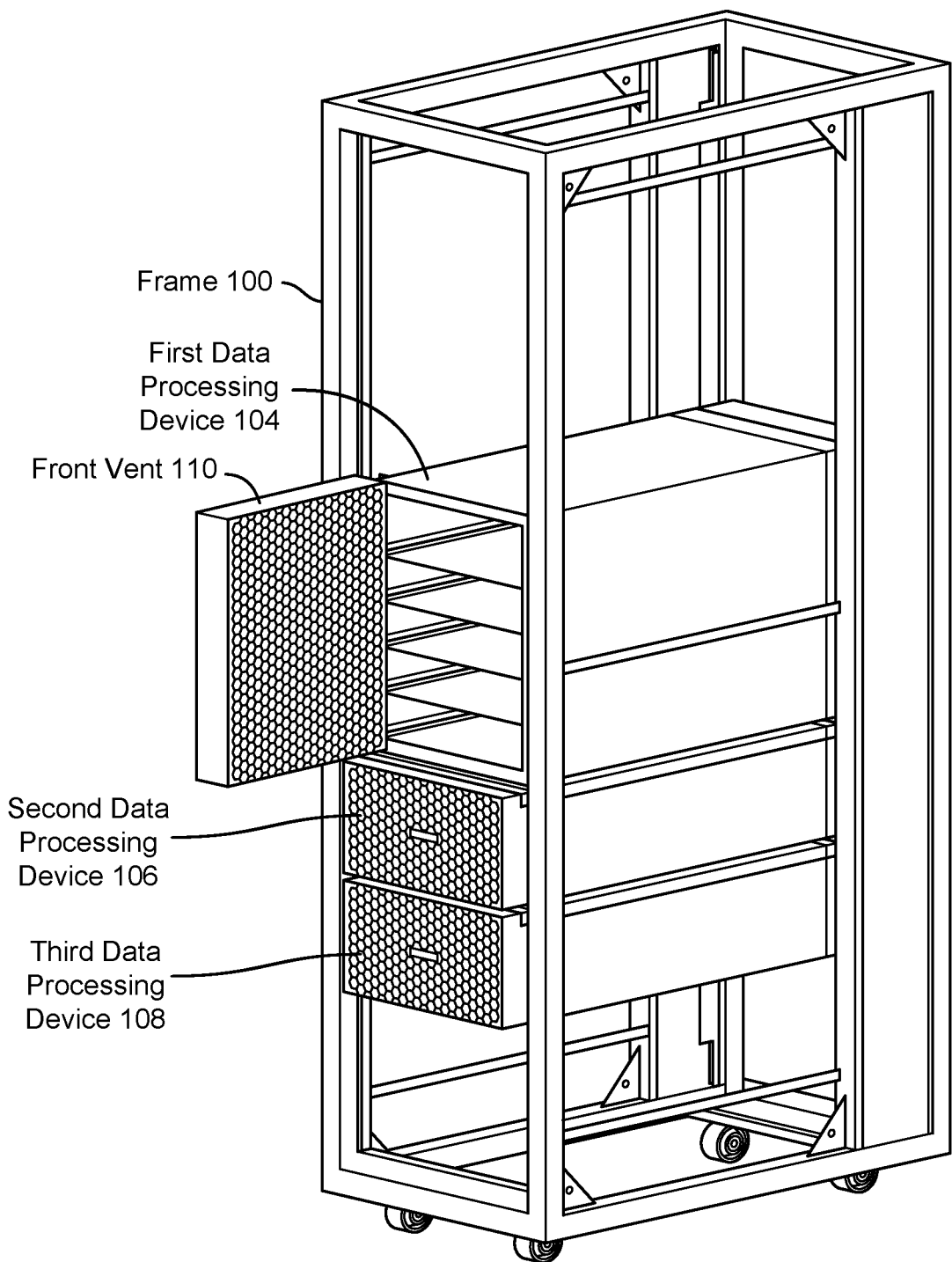
FIG. 1.2

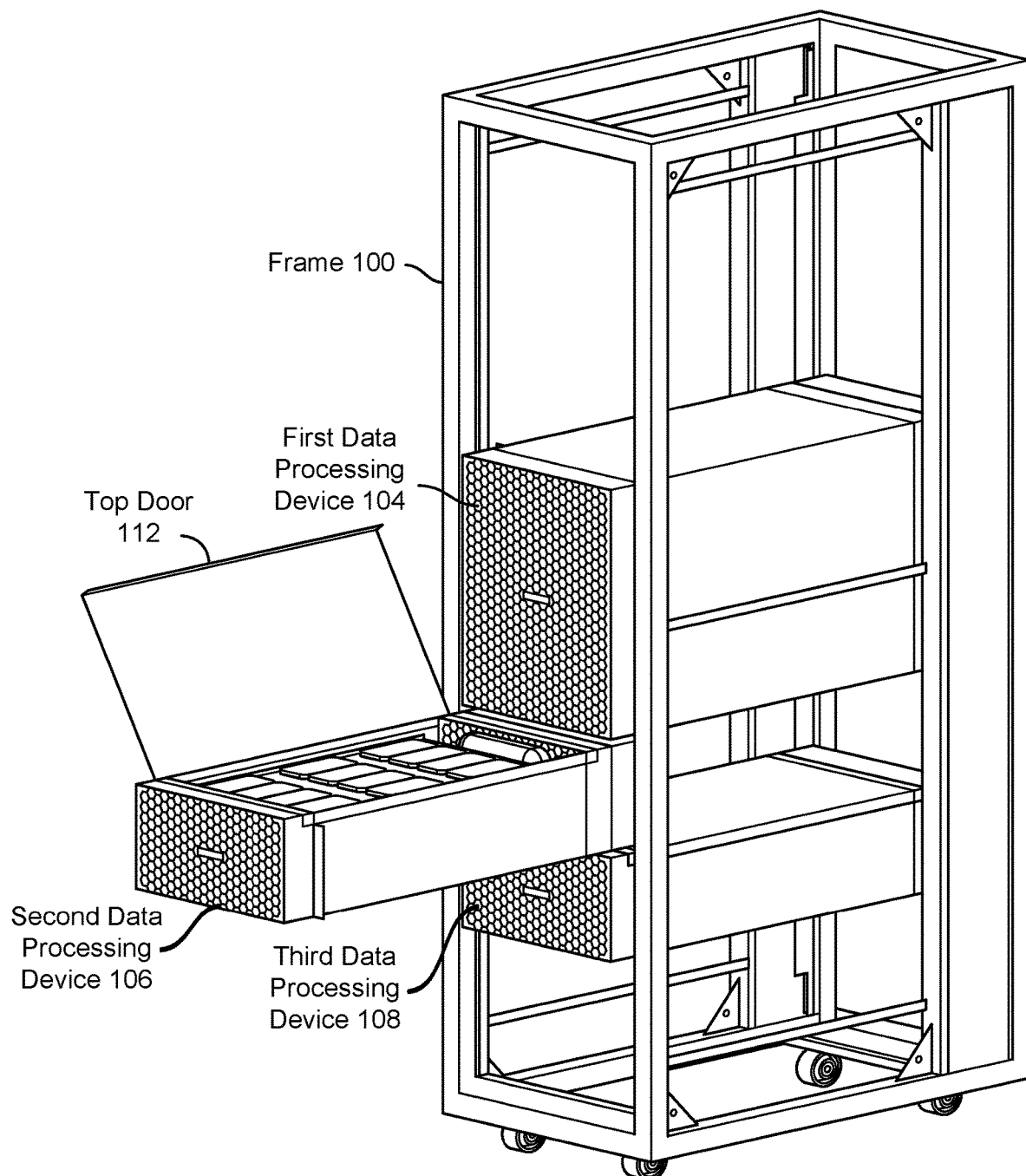
FIG. 1.3

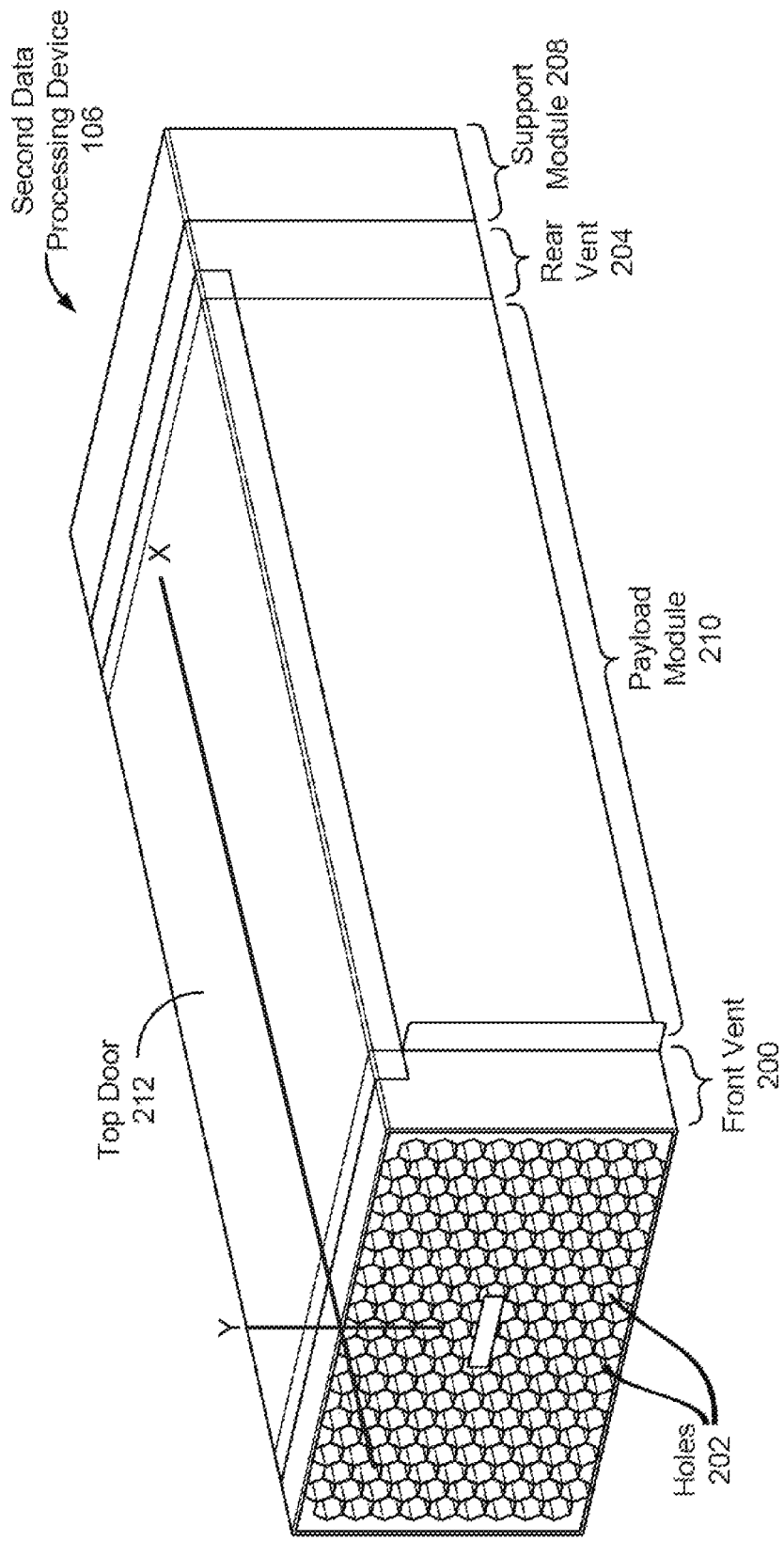
FIG. 2.1

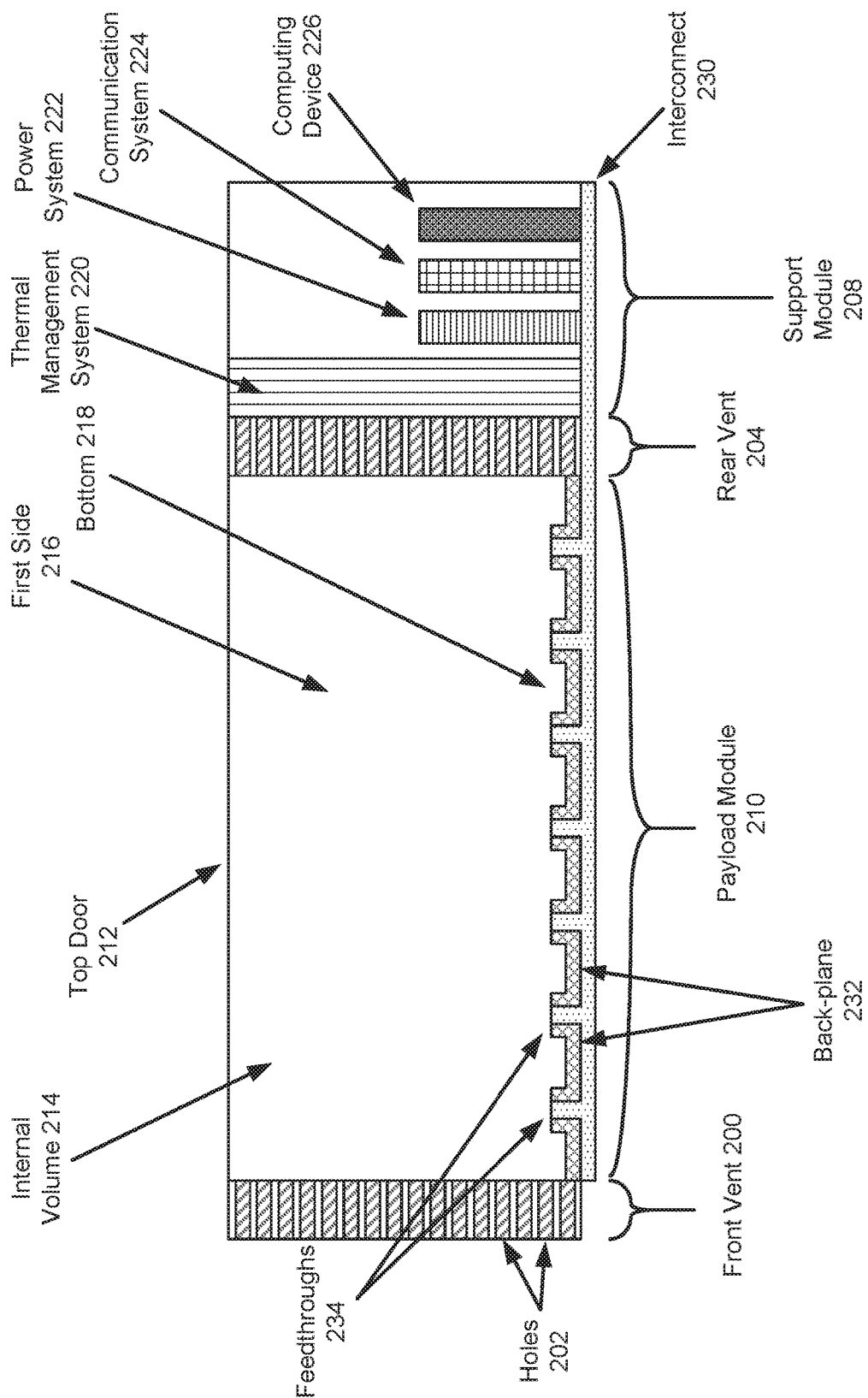
FIG. 2.2

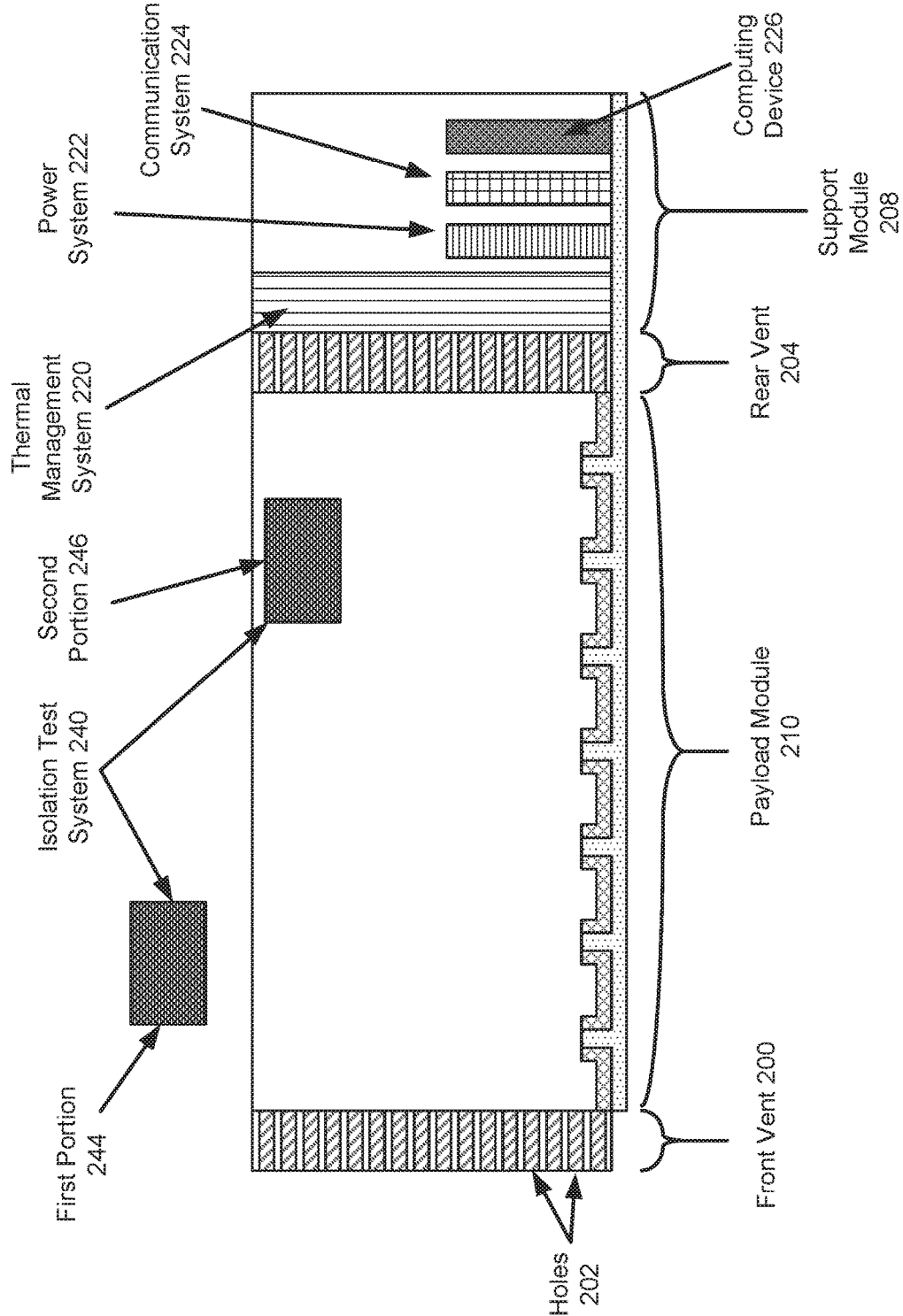
FIG. 2.3

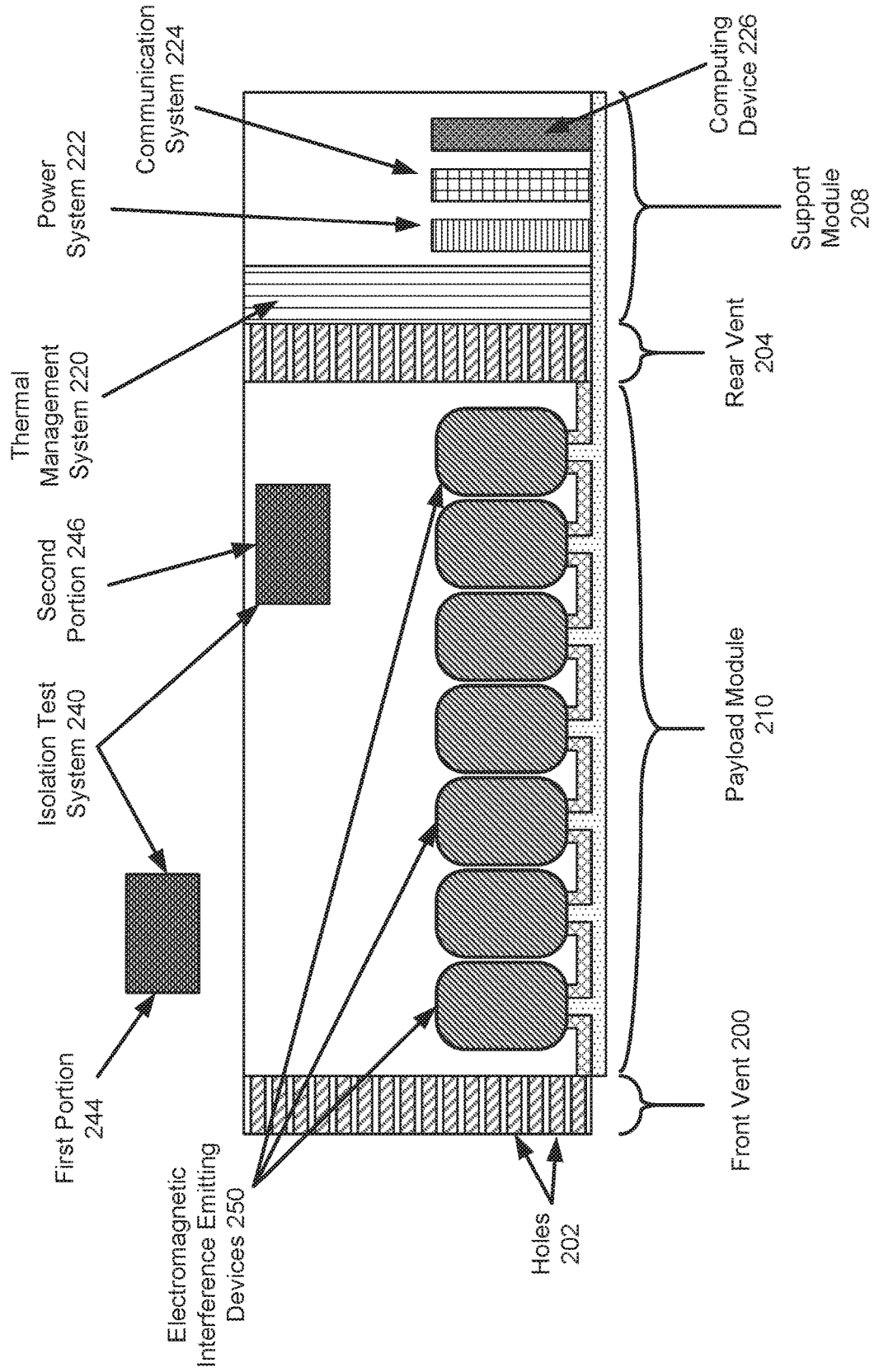
FIG. 2.4

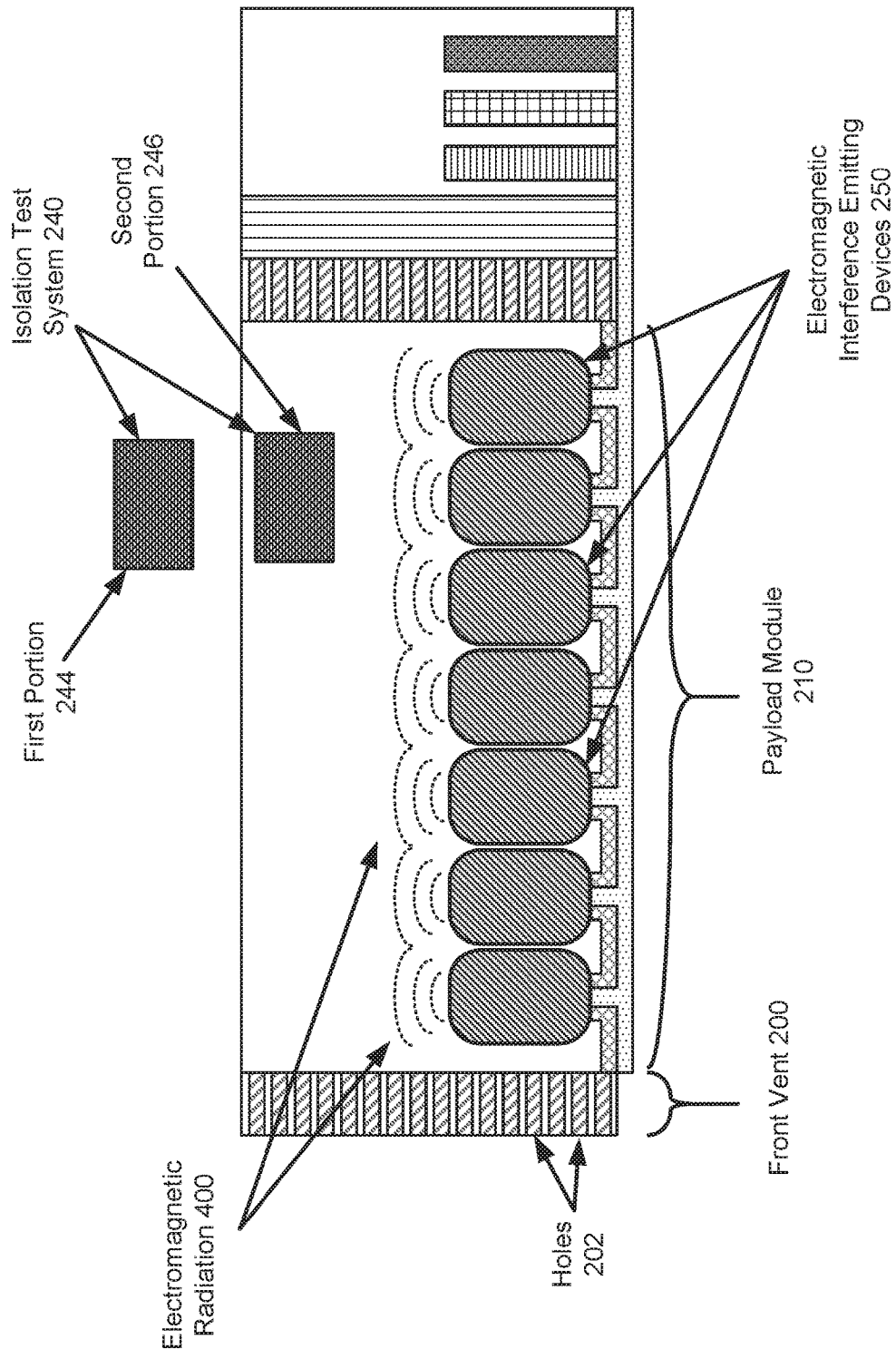
FIG. 4.1

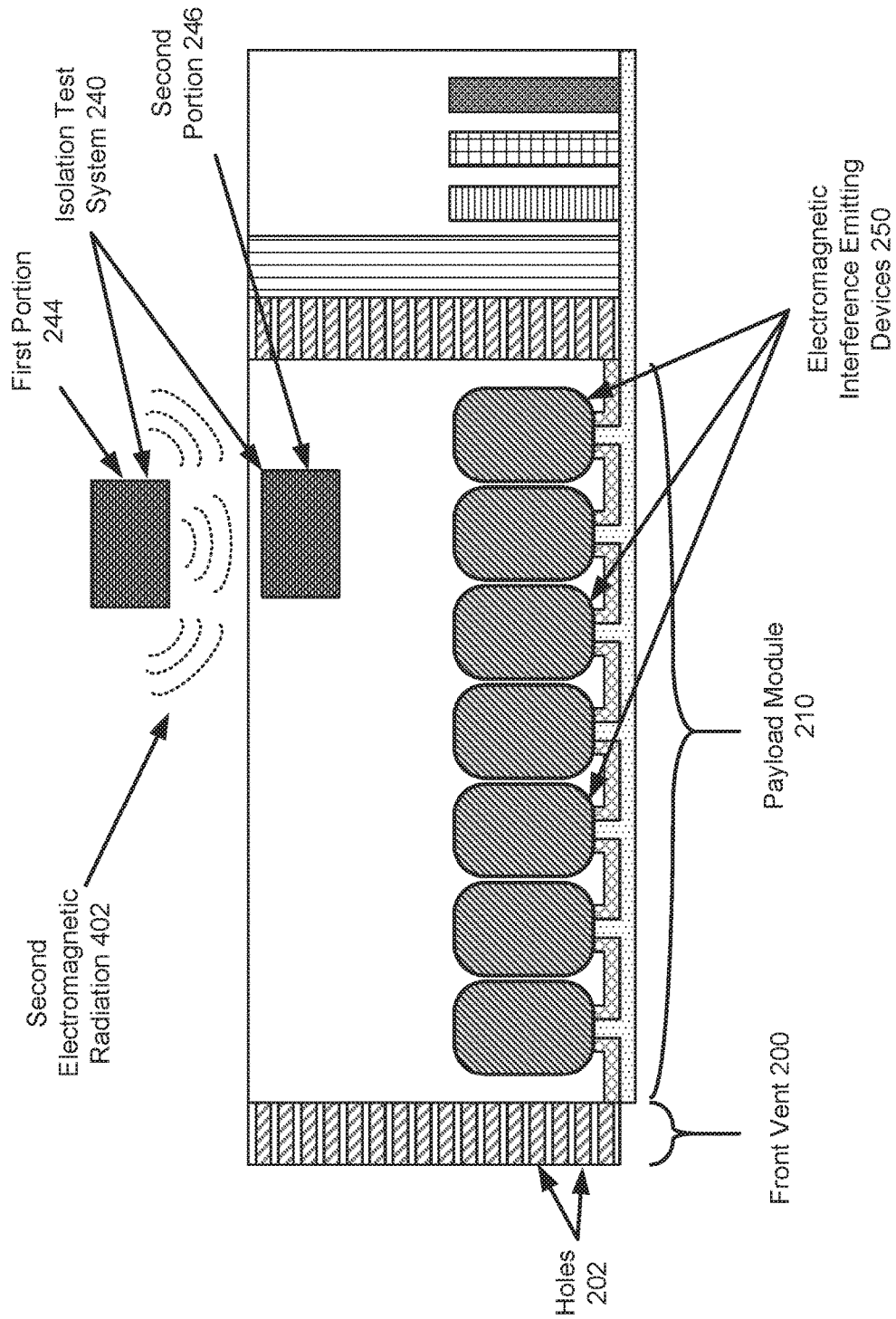
FIG. 4.2

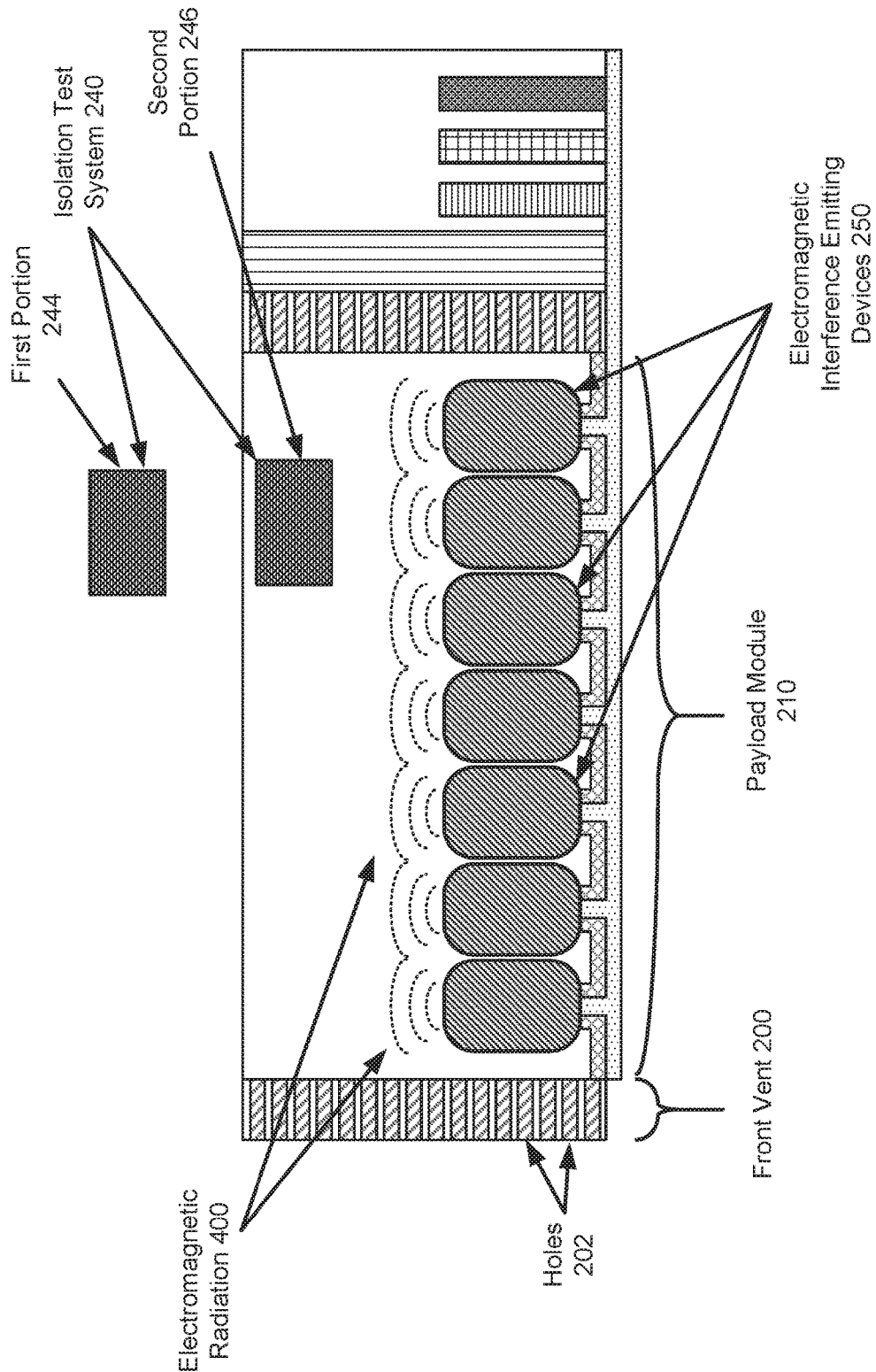
FIG. 4.3

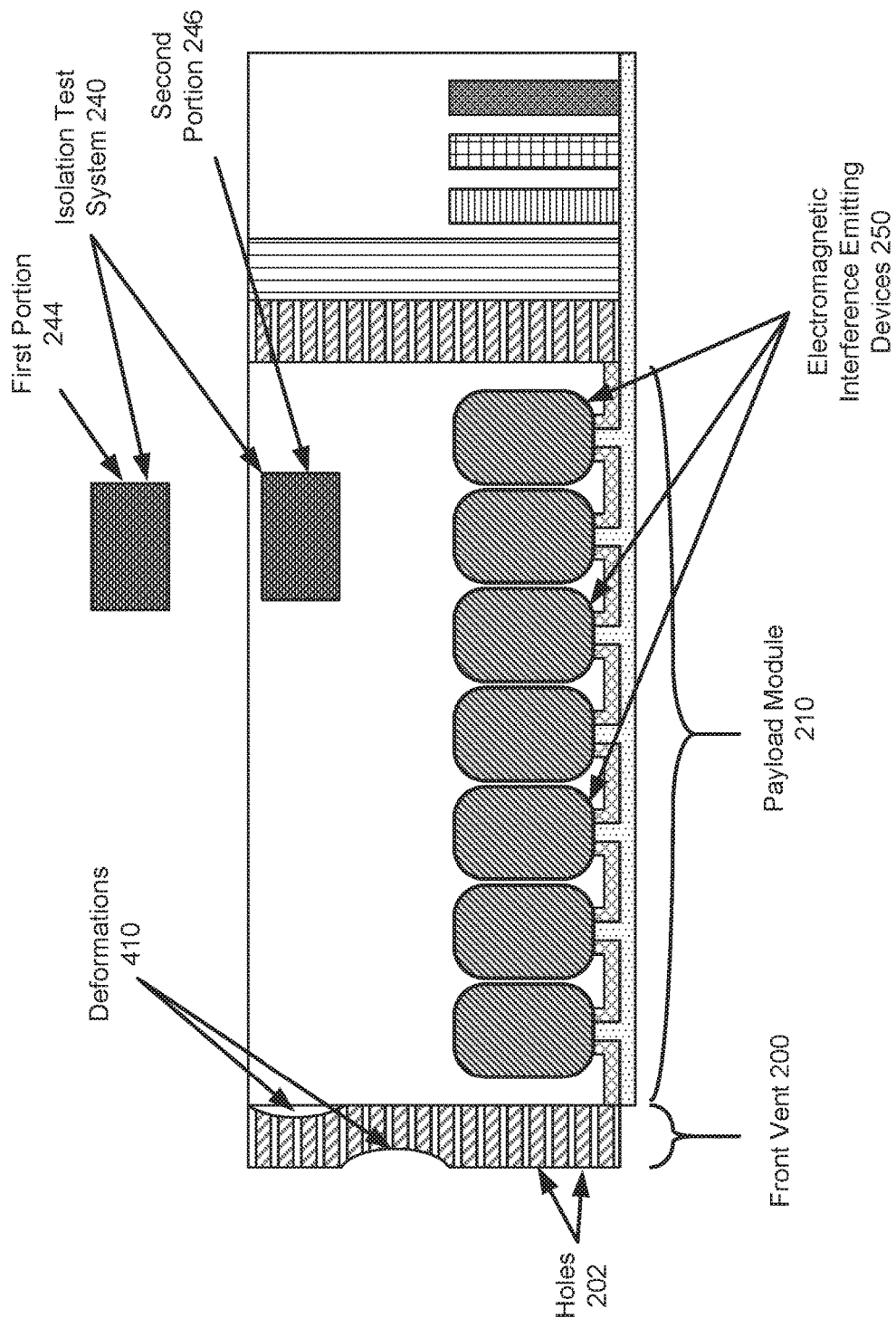
FIG. 4.4

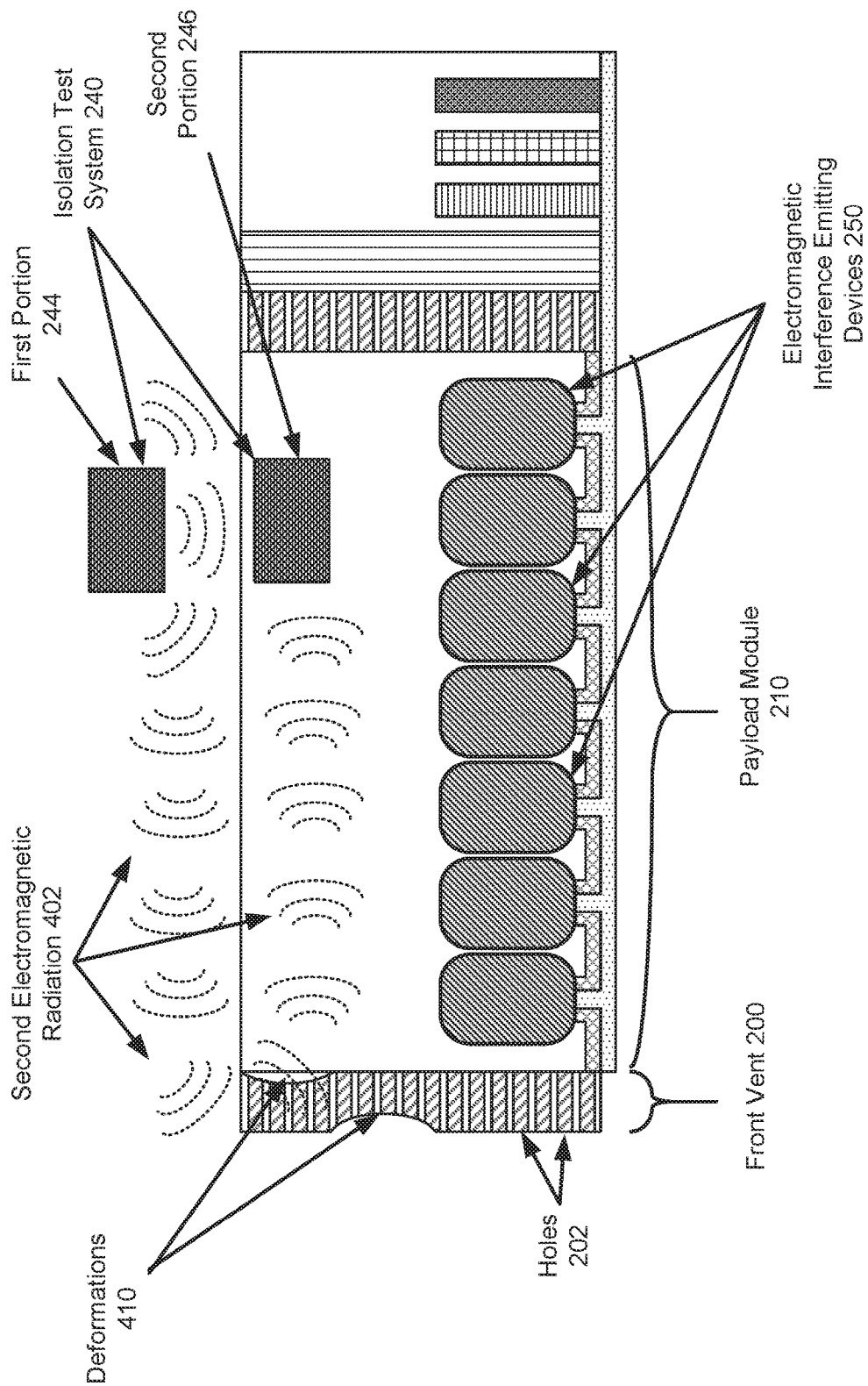
FIG. 4.5

SYSTEM AND METHOD FOR DEVICE STATE DETERMINATION

BACKGROUND

High density environment may include devices that are tightly packed together. In other words, the devices may be physically close to each other. Such an environment presents numerous challenges relating to thermal management, mechanical positioning and orienting of devices, and electrical concerns related to power and operation of such devices.

SUMMARY

In one aspect, a data processing device in accordance with one or more embodiments of the invention includes an internal volume for housing devices and an isolation test system. The isolation test system makes a determination that an electromagnetic interference suppression state of the data processing device is to be determined; in response to the determination: suppresses generation of electromagnetic radiation by the devices; while the generation of the electromagnetic radiation by the devices is suppressed: identifies a quantity of second electromagnetic radiation that propagated through a boundary of the internal volume; makes a second determination, based at least in part on the quantity, that the electromagnetic interference suppression state of the data processing device is an electromagnetic interference suppression compromised state; and initiates performance of an action set to remediate the electromagnetic interference suppression compromised state of the data processing device based on the second determination.

In one aspect, a method for managing electromagnetic interference (EMI) in accordance with one or more embodiments of the invention includes making a determination that an EMI suppression state of a data processing device is to be determined; in response to the determination: suppressing generation of electromagnetic radiation by devices disposed in the data processing device; while the generation of the electromagnetic radiation by the devices is suppressed: identifying a quantity of second electromagnetic radiation that propagated through a boundary of an internal volume of the data processing device; making a second determination, based at least in part on the quantity, that the EMI suppression state of the data processing device is an electromagnetic interference suppression compromised state; and initiating performance of an action set to remediate the electromagnetic interference suppression compromised state of the data processing device based on the second determination.

In one aspect, a non-transitory computer readable medium in accordance with one or more embodiments of the invention includes instructions that when executed by a data processing device cause the data processing device to perform a method for managing electromagnetic interference (EMI). The method includes making a determination that an EMI suppression state of a data processing device is to be determined; in response to the determination: suppressing generation of electromagnetic radiation by devices disposed in the data processing device; while the generation of the electromagnetic radiation by the devices is suppressed: identifying a quantity of second electromagnetic radiation that propagated through a boundary of an internal volume of the data processing device; making a second determination, based at least in part on the quantity, that the EMI suppression state of the data processing device is an electromagnetic interference suppression compromised state; and initiating performance of an action set to remediate the electromagnetic interference suppression compromised state of the data processing device based on the second determination.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 1.1 shows a diagram of an example system in accordance with one or more embodiments of the invention.

FIG. 1.2 shows a diagram of the example system of FIG. 1.1 in a first configuration in accordance with one or more embodiments of the invention.

FIG. 1.3 shows a diagram of the example system of FIG. 1.1 in a second configuration in accordance with one or more embodiments of the invention.

FIG. 2.1 shows a diagram of a second data processing device in accordance with one or more embodiments of the invention.

FIG. 2.2 shows a first cross section diagram of the data processing device of FIG. 2.1.

FIG. 2.3 shows a second cross section diagram of the data processing device of FIG. 2.1 including an isolation test system, FIG. 2.4 shows a third cross section diagram of the data processing device of FIG. 2.1 including the isolation test system and devices disposed in the internal volume of the data processing device.

FIGS. 4.1-4.5 show cross section diagrams of an example data processing device at different points in time.

DETAILED DESCRIPTION

Figure 3:
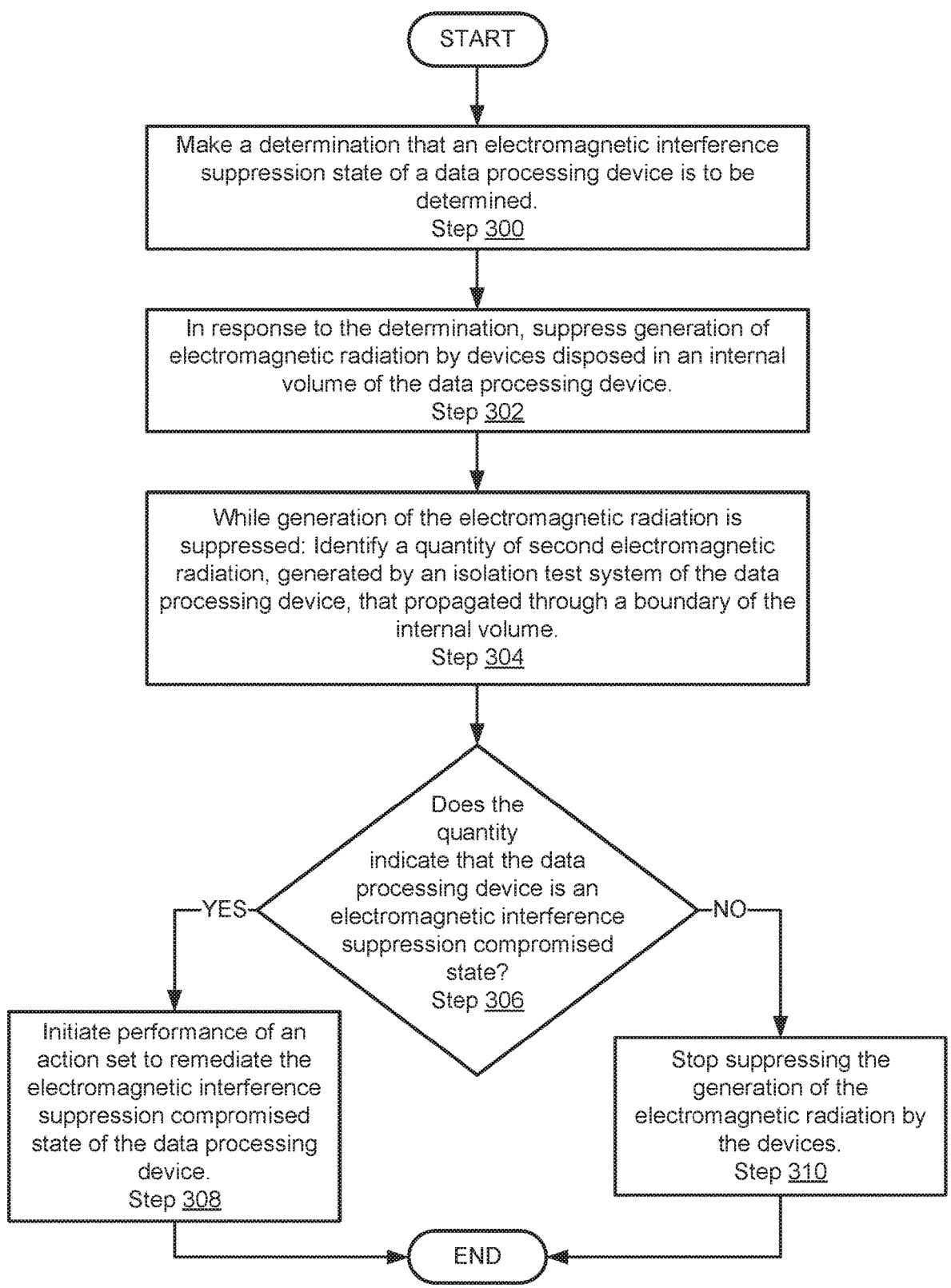
FIG. 3 shows a flowchart of a method of managing electromagnetic interference in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing electromagnetic interference in a high-density environment. Specifically, embodiments of the invention may provide a system that manages electromagnetic interference at a data processing device level. By doing so, embodiments of the invention may facilitate the inclusion of electromagnetic interference emitting devices in a high-density environment while mitigating the impact of electromagnetic interference generated by the electromagnetic interference emitting devices.

In one or more embodiments of the invention, a data processing device includes an internal volume for housing any number of electromagnetic interference emitting devices (and/or other types of devices). The data processing device may isolate the electromagnetic interference emitting devices and/or other types of devices from the ambient environment proximate to the data processing device by at least 90 decibels (or another desirable level of electromagnetic interference suppression).

In one or more embodiments of the invention, the data processing device proactively monitors its ability to isolate devices disposed within the internal volume. If the data processing device determines, based on the proactive monitoring, that the data processing device is unlikely to be able to isolate devices disposed in the internal volume, the data processing device may perform an action set to remediate its ability to isolate the devices.

In one or more embodiments of the invention, the data processing device includes an isolation test system. The isolation test system may facilitate monitoring of the ability of the data processing device to isolate devices disposed within the internal volume. The isolation test system may include a first portion disposed outside of the internal volume and a second portion disposed inside of the internal volume. The first portion and the tests portion may cooperate to determine the quantity of electromagnetic radiation is able to propagate through a boundary of the internal volume. The quantity of the electromagnetic radiation that is able to propagate through the boundary of the internal volume may be used to determine whether the data processing device is able to electromagnetically isolate the devices and internal volume.

FIG. 1.1 shows an example system in accordance with one or more embodiments of the invention. The system may include a frame (100) and any number of data processing devices (102). The components of the example system may provide electromagnetic interference management services for devices disposed within the data processing devices (102). By doing so, devices that emit electromagnetic interference may be utilized in a high-density computing environment without negatively impacting the high-density computing environment.

For example, one or more electromagnetic interference emitting devices may be disposed within one or more of the data processing devices (102). The system illustrated in FIG. 1.1 may manage the electromagnetic interference generated by the one or more electromagnetic interference emitting devices by (i) limiting the space in which electromagnetic interference is allowed to freely propagate, (ii) attenuating the electromagnetic interference as it propagates out of the limited space, (iii) determining whether electromagnetic interference has propagated out of the limited space and/or determining the likelihood that electromagnetic interference will propagate out of limited space in the future, and/or (iv) managing, based on the determination(s) of (iii), the operation of the data processing device and/or electromagnetic interference emitting devices to reduce the likelihood that electromagnetic interference will propagate out of the limited space in the future.

To do so, the system of FIG. 1.1 may reduce the strength of the electromagnetic interference when propagating from inside of a portion of the data processing devices (102) to an ambient environment (or other portions of the data processing devices (102)) around the data processing devices (102) and/or other locations by at least 90 decibels (or another suitable level of suppression such as, for example, between 30-45 decibels, between 45-60 decibels, between 60-75 decibels, between 75-90 decibels, or greater than 90 decibels). For example, a data processing device in accordance with embodiments of the invention may provide greater than 35 decibels of isolation, between 35-50 decibels of isolation, between 50-65 decibels of isolation, between 65-80 decibels of isolation, and/or greater than 80 decibels of isolation.

The electromagnetic interference isolation provided by the data processing devices (102) may have a frequency dependent response. For example, the data processing devices (102) may provide at least 90 decibels (dB), or another suitable level of isolation, across a frequency band in which devices that may be disposed within the data processing devices (102) are adapted to emit electromagnetic interference. In other frequency bands, the data processing devices (102) may provide different level or no electromagnetic interference isolation for devices disposed within the data processing devices (102).

Accordingly, a data processing device in accordance with one or more embodiments of the invention may provide electromagnetic interference suppression services that are frequency dependent. In one or more embodiments of the invention, a data processing device provides electromagnetic interference isolation by reducing the strength of electromagnetic interference across at least one frequency band by a predetermined amount (e.g., 90 decibels).

Additionally, the system of FIG. 1.1 may diagnose whether any of the data processing devices are in a state (e.g., an electromagnetic interference suppression compromised state) that would enable electromagnetic interference to propagate from within the data processing devices to an ambient environment (or other portions of the data processing devices) without an appropriate level of attenuation (e.g., 90 decibels). If the system diagnoses that a data processing device is in such a state, the system may take action to reduce the likelihood of electromagnetic interference propagating into the ambient environment with attenuation.

The action may include performing an action set. The action set may be associated with one or more characteristics of the data processing device that is in the electromagnetic interference suppression compromised state. Performing the action set may remediate the state of the data processing device so that the data processing device is a second state (e.g., an electromagnetic interference suppressed state) in which electromagnetic radiation (e.g., the electromagnetic interference) that propagates from within the data processing device to an ambient environment is attenuated by an appropriate level (e.g., more than 30 decibels).

An electromagnetic interference emitting device may be any type of hardware device that intentionally emits electromagnetic radiation as part of its operation. The emissions of electromagnetic radiation may be, for example, continuous, periodic, or intermittent (e.g., at any point in time based on the operation of the respective electromagnetic interference emitting device). An electromagnetic interference emitting device may be, for example, a personal electronic device such as a cellular device (e.g., smart phone, cell phone, etc.), a personal computer (e.g., any type of computing device with wireless communication capabilities such as a tablet computer, a laptop computer, etc.), a watch (e.g., a wireless smart watch), or any other type of hardware device that intentionally emits electromagnetic radiation for any purpose (e.g., communications, detection, etc.).

The electromagnetic interference emitted by an electromagnetic interference emitting device may be frequency dependent. That is, the electromagnetic interference emitted by the electromagnetic interference emitting device may be stronger in a first frequency band and weaker in a second frequency band. To provide electromagnetic interference suppression services, a data processing device in accordance with one or more embodiments of the invention may attenuate the electromagnetic interference emitted by an electromagnetic interference emitting device by at least a predetermined amount (e.g., 80 decibels) across at least one frequency band in which the electromagnetic interference emitting device emits electromagnetic interference. The at least one frequency band may be, for example, the frequency band in which the emitted electromagnetic interference has a largest magnitude.

In one or more embodiments of the invention, an electromagnetic interference emitting device emits electromagnetic interference having frequency content between 700 megahertz and 10 gigahertz. An electromagnetic interference emitting device may emit electromagnetic interference having different frequency content without departing from the invention.

To further discuss aspects of embodiments of the disclosed technology, each component of the system of FIG. 1.1 is discussed below.

In one or more embodiments of the invention, the frame (100) is a physical structure. The physical structure may be adapted to facilitate storage of the data processing devices (102) in a high-density computing environment. The high-density computing environment may be, for example, a data center or another type of location where multiple data processing devices are located. To facilitate storage of the data processing devices (102), the frame (100) may include any number of structural members (e.g., beams, brackets, bars, etc.) and any number of mechanical mounting points (e.g., holes, threaded portions, etc.) disposed on the structural members to facilitate storage of the data processing devices (102).

Different structural members may have different shapes, sizes, and/or other physical characteristics. The shapes, sizes, and/or other physical characteristics of the structural members may be adapted to enable the structural members to be mechanically connected (e.g., permanently or reversibly connected) to each other to form a predetermined structure. The predetermined structure may be, for example, a cage, box, or other type of structure that facilitates positioning and/or orienting the data processing devices (102).

When all, or a portion, of the structural members are mechanically connected to each other, the mechanical mounting points may be disposed at predetermined locations. The predetermined locations may correspond to similar predetermination locations on the data processing devices (102) where mechanical mounting elements, complementary to the mechanical mounting point, are disposed. By doing so, the frame (100) and the data processing devices (102) may be adapted to position the data processing devices (102) in locations and/or orientations compatible with a high-density computing environment, or another environment in which the data processing devices (102) may be located.

The mechanical mounting points may be any type of physical structure for attaching (permanently or reversibly) the data processing devices (102) to the frame (100). There may be any number of mechanical mounting points to facilitate the attachment of any number of data processing devices.

The frame (100) may be implemented using any number of suitable materials. For example, portions of the frame (100) may be implemented using metals (e.g., steel, aluminum, etc.). In another example, portions of the frame (100) may be implemented using polymers (e.g., Polyamides, polycarbonates, polyester, polyethylene, polypropylene, polystyrene, polyurethanes, polyvinyl chloride, polyvinylidene chloride, acrylonitriline butadiene styrene, etc.). In a still further example, portions of the frame (100) may be implemented using rubber (e.g., latex, styrene-butadiene rubbers, etc.) The frame (100) may be implemented using any quantity and combination of suitable materials without departing from the invention.

In one or more embodiments of the invention, the data processing devices (102) are physical structures. For example, the data processing devices (102) may include a chassis and one or more computing devices disposed within the chassis. For additional details regarding computing devices, refer to FIG. 5.

A chassis may be a mechanical device that is adapted to (i) facilitate attachment of the data processing device to the frame, (ii) house the one or more computing devices, (iii) house one or more electromagnetic interference emitting devices, and/or (iv) provide thermal management services to the computing devices and/or the electromagnetic interference emitting devices. For example, a chassis may be a frame mountable structure (e.g., a rectangular box) that includes internal space that may be used to house computing devices and/or electromagnetic interference emitting devices. Thus, the chassis may be a frame mountable chassis.

The chassis may be implemented using any number of suitable materials. For example, portions of the chassis may be implemented using metals (e.g., steel, aluminum, etc.). In another example, portions of the chassis may be implemented using polymers (e.g., Polyamides, polycarbonates, polyester, polyethylene, polypropylene, polystyrene, polyurethanes, polyvinyl chloride, polyvinylidene chloride, acrylonitriline butadiene styrene, etc.). In a still further example, portions of the chassis may be implemented using rubber (e.g., latex, styrene-butadiene rubbers, etc.) The chassis may be implemented using any quantity and combination of suitable materials without departing from the invention.

To facilitate attachment of the data processing device to the frame, the chassis may include any number of mechanical mounting elements. The mechanical mounting elements may be located at predetermined locations. The predetermined locations may correspond to similar predetermination locations on the frame (100) where mechanical mounting points, complementary to the mechanical mounting elements, are disposed.

For example, a mechanical mounting element may be a rail disposed on a side of a chassis of a data processing device. The location of the rail may correspond to a position on the frame (100) where a rail guide (i.e., a complementary mechanical mounting point) is disposed. The rail and the rail guide may facilitate attachment of a data processing device to the frame (100) which, in turn, positions and orients the data processing device relative to the frame (100).

To house the one or more computing devices, the chassis may include one or more internal volumes. The internal volumes may facilitate disposing of the one or more computing devices (and/or other devices such as electromagnetic interference emitting devices) within a data processing device.

To house the one or more electromagnetic interference emitting devices, the chassis may include one or more internal volumes. The internal volumes may have a shape or other characteristic(s) that facilitates disposing of the one or more electromagnetic interference emitting devices within the data processing device. For example, an internal volume of the chassis may be a rectangular (or other shaped) void capable of housing one or more electromagnetic interference emitting devices and/or other types of devices.

In one or more embodiments of the invention, the one or more internal volumes of the data processing devices are adapted to restrict propagation of electromagnetic interference emitted by the electromagnetic interference emitting devices (and/or other devices such as computing devices). For example, one or more portions of the chassis that bound the one or more internal volumes may be made of metal of a predetermined thickness to prevent and/or limit transmission of electromagnetic interference through the one or more portions of the chassis. By doing so, the electromagnetic interference generated by the electromagnetic interference emitting devices may be prevented (or at least severely attenuated when leaving an internal volume) from propagating from within the data processing devices (102) into the ambient environment surrounding the respective data processing devices (102).

In another example, one or more portions of the chassis that bound the one or more internal volumes may be formed in a manner that filters (e.g., reflects/attenuates radiation of a certain frequency while allowing radiation of other frequencies to propagate) electromagnetic radiation when electromagnetic radiation passes through the portions of the chassis. For example, a portion of the chassis that bounds the one or more internal volumes may be a waveguide filter such as an array of holes (e.g., sub-wavelength apertures corresponding to a particular frequency below which are severely attenuated) in a metal sheet. By doing so, the electromagnetic interference generated by the electromagnetic interference emitting devices may be severely attenuated (e.g., attenuated by greater than 90 decibels or another suitable level) when propagating from within the data processing devices (102) into the ambient environment surrounding the respective data processing devices (102).

In a further example, one or more portions of the chassis that bound the one or more internal volumes may be made of an electromagnetic radiation attenuating material of a predetermined thickness to prevent and/or limit transmission of electromagnetic interference (e.g., electromagnetic radiation) through the one or more portions of the chassis. The electromagnetic radiation attenuating material may be, for example, a composite of plastic or rubber that includes particulates of iron, carbonyl iron, or other electromagnetically lossy material(s). By doing so, the electromagnetic interference generated by the electromagnetic interference emitting devices (and/or other types of devices) may be severely attenuated (e.g., attenuated by greater than 90 decibels or another suitable level) when propagating from within the data processing devices (102) into the ambient environment surrounding the respective data processing devices (102).

To provide thermal management services to the computing devices, the electromagnetic interference emitting devices, and/or other types of devices, the data processing devices (102) may facilitate the flow of gas proximate to the computing devices and/or electromagnetic interference emitting devices. By doing so, the thermal state (i.e., temperature) of the aforementioned devices may be regulated. The gas may be air or another type/combination of gasses obtained from any source.

For example, a data processing device may include one or more vents that enable gas from a first side of a data processing device to flow into the data processing device, through the data processing device, and out of a second side of the data processing device. The gas, flowing through the data processing device, may be at a different temperature than the computing devices and/or electromagnetic interference emitting devices. Consequently, thermal exchange between the flow of gas and the aforementioned devices may occur resulting in the temperature of the aforementioned devices changing. By doing so, heat generated by the aforementioned devices may be expelled from the devices thereby regulating the temperature of the aforementioned devices.

A system in accordance with embodiments of the invention may include any number of data processing devices. Different data processing devices (102) may have different configurations and/or uses within the system.

For example, some data processing devices may be adapted to house many electromagnetic interference emitting devices (and/or other types of devices) while other data processing devices may be primarily adapted to house computing devices. Additional data processing devices may be adapted to exclusively house data processing devices and no electromagnetic interference emitting devices. A system in accordance with embodiments of the invention may include any number and combination of data processing devices adapted for any number of different uses without departing from the invention.

By way of example, the system of FIG. 1.1 may include a first data processing device (104). The first data processing device (104) may be of a larger size than a second data processing device (106) and, consequently, may be capable of housing a larger number of electromagnetic interference emitting devices and/or other types of devices. The system of FIG. 1.1 may further include a third data processing device (108). In contrast to the first data processing device (104) and the second data processing device (106), the internal structure of the third data processing device (108) may be adapted to only housing computing devices rather than electromagnetic interference generating devices.

For additional details regarding data processing devices, refer to FIGS. 2.1-2.4.

As discussed above, data processing devices (102) may house electromagnetic interference emitting devices. When so housed, the electromagnetic interference emitting devices may operate thereby generating electromagnetic interference (e.g., electromagnetic radiation). At different points in time, it may be useful to add or remove electromagnetic interference emitting devices to or from the data processing devices (102). To facilitate such additions and/or removals, different portions of the data processing devices (102) may be adapted to reversibly provide access to the internal volumes of the data processing devices.

For example, the different portions of the data processing devices (102) may be adapted to rotate, translate, or otherwise move with respect to the remaining portions of the data processing devices (102). When the different portions of the data processing devices (102) are in a first predetermination position and/or orientation, they may electromagnetically seal one or more internal volumes of the data processing devices (102). That is, they may limit the extent to which electromagnetic radiation within the internal volumes is able to propagate to an ambient environment. However, when the different portions of the data processing devices (102) are rotated, translated, and/or otherwise moved to a second predetermined position and/or orientation to enable access to the internal volumes, the data processing devices (102) may not be electromagnetically sealed. Consequently, electromagnetic radiation within the internal volumes may be less limited by the data processing devices (102) to propagate into the ambient environment when access to the internal volumes is provided.

The data processing devices (102) may include hinges, slides, knobs, and/or other mechanical devices that facilitate movement of the different portions of the data processing devices (102) to reversibly reconfigure the data processing devices (102) between states where access (i.e., physical accessibility) to the internal volumes of the data processing devices (102) is provided and states where access to the internal volumes of the data processing devices (102) is not provided. FIGS. 1.2-1.3 show diagrams of the data processing devices (102) facilitating the addition, modification, and/or removal of electromagnetic interference emitting devices from the internal volumes of the data processing devices (102).

While the system of FIG. 1.1 has been illustrated as including a limited number of components, a system in accordance with embodiments of the invention may include any number of frames, data processing devices, and/or other components without departing from the invention. For example, any number of frames (and/or other types of physical devices for positioning/orienting devices) may be used in a high density computing environment to facilitate the placement and/or orientation of any number of data processing devices. Further, the frames may be used to position and/or orient other types of devices. The other types of devices may be, for example, servers, storage nodes, compute nodes, communication devices (e.g., switches, routers, etc. for facilitating communications between any number of devices and/or devices external to a high density computing environment), or any other type of device that may be used in a computing environment (e.g., data center, computing nodes, communications center, etc.). Thus, the frame and data processing devices may be used in conjunction with any number and/or type of other device without departing from the invention.

FIG. 1.2 shows a diagram of the example system of FIG. 1.1 in a configuration (i.e., after a reconfiguration from the configuration illustrated in FIG. 1.1) where a front vent (110) of the first data processing device (104) has been opened. The front vent (110) may be opened by physically rotating and/or translating the front vent (110) to move the front vent (110) to a new physical location. By opening the front vent (110), physical access to internal volumes of the first data processing device (104) may be provided. Consequently, the internal configuration of the internal volumes of the first data processing device (104) may be modified. For example, electromagnetic interference emitting devices may be removed from and/or added to the internal volumes. Similarly, computing devices may be added to and/or removed from the internal volumes.

However, in the state illustrated in FIG. 1.2, the ability of the first data processing device (104) to limit propagation of and/or attenuate electromagnetic interference generated by electromagnetic interference emitting devices disposed within the first data processing device (104) may be compromised. In other words, the first data processing device (104) may be in an electromagnetic interference suppression compromised state that allows electromagnetic interference within internal volumes of the first data processing device (104) to propagate to the ambient environment around the first data processing device (104) without attenuation. In contrast, in the state illustrated in FIG. 1.1, the first data processing device (104) may be in an electromagnetic interference suppressed state (i.e., electromagnetic interference generated by the electromagnetic interference emitting devices may be contained within the internal volumes and/or attenuated by greater than 90 decibels when propagating out of the internal volumes).

In some embodiments of the invention, the first data processing device (104) automatically causes all, or a portion, of the electromagnetic interference emitting devices disposed within its internal volumes to suspend generation of electromagnetic interference when in the electromagnetic interference suppression compromised state illustrated in FIG. 1.2. By doing so, the first data processing device (104) may provide electromagnetic interference management services when the first data processing device (104) is in an electromagnetic interference suppression compromised state. All, or a portion, of the data processing devices of a system in accordance with embodiments of the invention may provide similar electromagnetic interference management services.

Similar to FIG. 1.2, FIG. 1.3 shows a diagram of the example system of FIG. 1.1 in a second configuration (i.e., after a reconfiguration from the configuration illustrated in FIG. 1.1) where a top door (112) of the second data processing device (106) has been opened after translating the second data processing device (106) with respect to the frame. The top door (112) may be all, or a portion, of the chassis that may be reversibly moved to enable access to internal volumes of the first data processing device (104).

Open the top door (112), for example, the second data processing device (106) may be mounted to the frame (100) via rails that enable the second data processing device (106) to translate with respect to the frame (100) via application of physical force. Once translated to a predetermined location, the top door (112) may be opened by application of physical force by a user.

By opening the top door (112), physical access to the internal volumes of the second data processing device (106) may be provided. Consequently, the internal configuration of the internal volumes of the second data processing device (106) may be modified. For example, electromagnetic interference emitting devices may be removed from and/or added to the internal volumes of the second data processing device (106). Similarly, computing devices may be added to and/or removed from the internal volumes of the second data processing device (106).

However, in the state illustrated in FIG. 1.3, the ability of the second data processing device (106) to limit propagation of and/or attenuate electromagnetic interference generated by electromagnetic interference emitting devices disposed within the second data processing device (106) may be compromised. In other words, the second data processing device (106) may be in an electromagnetic interference suppression compromised state that allows electromagnetic interference within internal volumes of the second data processing device (106) to propagate to the ambient environment around the second data processing device (106) without attenuation. In contrast, in the state illustrated in FIG. 1.1, the first data processing device (104) may be in an electromagnetic interference suppressed state (i.e., electromagnetic interference generated by the electromagnetic interference emitting devices may be contained within the internal volumes and/or attenuated by greater than 90 decibels when propagating out of the internal volumes).

In some embodiments of the invention, the second data processing device (106) automatically causes all, or a portion, of the electromagnetic interference emitting devices disposed within its internal volumes to suspend generation of electromagnetic interference when in the electromagnetic interference suppression compromised state illustrated in FIG. 1.3. By doing so, the second data processing device (106) may provide electromagnetic interference management services when the second data processing device (106) is in an electromagnetic interference suppression compromised state. All, or a portion, of the data processing devices of a system in accordance with embodiments of the invention may provide similar electromagnetic interference management services (e.g., automatically terminating and/or resuming the electromagnetic interference generation depending on the electromagnetic interference suppression state of the data processing device).

Thus, as illustrated in FIGS. 1.1-1.3, a system in accordance with embodiments of the invention may provide electromagnetic interference management services to devices disposed with the data processing devices when the data processing devices are in an electromagnetic interference suppression compromised state or an electromagnetic interference suppressed state.

As discussed above, a system in accordance with one or more embodiments of the invention may include one or more data processing devices. FIGS. 2.1-2.4 show diagrams of data processing devices in accordance with embodiments of the invention.

FIG. 2.1 shows a diagram of the second data processing device (106) in accordance with one or more embodiments of the invention. As discussed above, the second data processing device (106) may provide electromagnetic interference management services for electromagnetic interference emitting devices disposed within the second data processing device (106). In addition to electromagnetic interference management services, the second data processing device (106) may provide power management services and communications services. The aforementioned services may be provided to electromagnetic interference emitting devices and/or computing devices and/or other types of devices disposed within the second data processing device (106).

To do so, the second data processing device (106) may include a chassis (198). The chassis (198) may be a structure that is mountable to a frame. By being mountable to a frame, the chassis (198) may be usable in a high density environment. For example, the chassis (198) may be a rail mount chassis. The chassis (198) may be mountable via other methods (e.g., using mechanical features other than rails such as bolts, screws, pins, etc.).

The chassis (198) may include a front vent (200), a rear vent (204), a support module (208), and a payload module (210). Each of these components of the second data processing device (106) is discussed below.

The front vent (200) may be a physical device for (i) enabling gas flow through the second data processing device (106) and (ii) limiting the propagation of electromagnetic interference from an internal volume of the second data processing device (106) and/or attenuating electromagnetic interference that propagates from an internal volume of the second data processing device (106) to an ambient environment around the second data processing device (106) via the front vent (200).

In one or more embodiments of the invention, the front vent (200) reflects and/or attenuates electromagnetic radiation that is propagating from the internal volume (214) to an ambient environment through the front vent (200) by at least 90 decibels (or another suitable level such as, for example, 30 decibels, 45 decibels, 60 decibels, 75 decibels, etc.). By doing so, the front vent (200) may delineate one of the walls of the internal volume to enable the internal volume to be electromagnetically suppressed and/or isolated by 90 decibels (or another suitable level of suppression/isolation) from the ambient environment and/or other portions of the chassis (e.g., the support module (208)).

In one or more embodiments of the invention, the front vent (200) is a rectangular structure formed with holes (202) that enable gasses to flow between the ambient environment surrounding the second data processing device (106) and an internal volume of the second data processing device (106). By doing so, the second data processing device (106) may provide thermal management services to components disposed within the second data processing device (106) by controlling the flow of gasses from the ambient environment through the second data processing device (106).

For example, the second data processing device (106) may be used in a high-density computing environment in which a source of cool gas is supplied to a first side of the second data processing device (106). In such an environment, the second data processing device (106) may cause the cool gas to flow into the second data processing device (106) via the front vent (200) and exhaust gas out a second side of the second data processing device (106) (e.g., out of the support module (208)). Alternatively, the second data processing device (106) may cause a reverse gas flow, with respect to the gas flow discussed above, if the source of cool gas is supplied proximate to the support module (208) rather than proximate to the front vent (200).

The structure of the front vent (200) may also be adapted to limit propagation of electromagnetic radiation through the front vent (200) and/or attenuate electromagnetic radiation that propagates through the front vent (200). For example, the size, position, number, shape, and/or other characteristics of the holes (202) through the front vent may be adapted to (i) limit propagation of electromagnetic radiation and/or (ii) attenuate propagating electromagnetic radiation. In another example, the thickness and material choice of the front vent (200) may be adapted to (i) limit propagation of electromagnetic radiation and/or (ii) attenuate propagating electromagnetic radiation. By being so adapted, the front vent (200) may attenuate electromagnetic radiation that propagates through the front vent (200) by at least 90 decibels or another desirable quantity (e.g., 30 decibels, 45 decibels, 60 decibels, 75 decibels, 120 decibels, etc.).

To facilitate the flow of gas between the ambient environment and the internal volume of the second data processing device (106), the size, position, number, shape, and/or other characteristics of the holes (202) may be selected to meet gas flow requirements for thermal management purposes while providing electromagnetic interference suppression characteristics.

In one or more embodiments of the invention, the rear vent (204) is similar to the front vent (200). For example, the rear vent (204) may provide similar attenuation and/or restriction of propagation of electromagnetic radiation while enabling gasses to flow between internal volumes of the second data processing device. The rear vent (204) may have a similar structure to that of the front vent (200). However, the structure (e.g., different hole pattern, thickness, hole type, etc.) and/or electromagnetic (e.g., attenuation and/or reflection of electromagnetic radiation) and/or hydrodynamic (e.g., impedance to fluid flow) characteristics of the rear vent (204) may be different from the front vent (200) without departing from the invention.

The payload module (210) may be a physical device for (i) housing electromagnetic interference devices (and/or other types of devices), (ii) limiting propagation of electromagnetic interference from internal volumes of the second data processing device (106) to the ambient environment surrounding the second data processing device (106), and/or (iii) thermally regulating devices disposed within the payload module (210). For additional details regarding the payload module (210), refer to FIG. 2.2.

The support module (208) may be a physical device for housing devices that provide services to devices disposed within the payload module (210). For example, the support module (208) may house one or more power supplies (e.g., a power system), fans (e.g., a thermal management system), networking devices (e.g., a communication system), and/or computing devices. The aforementioned devices may provide corresponding services to devices disposed in other portions of the second data processing device (106) and/or devices located in other locations (i.e., external to the second data processing device (106).

In one or more embodiments of the invention, the support module (208) does not provide electromagnetic interference management services to devices disposed within the support module (208), in contrast to the payload module (210). For example, the support module (208) may not intentionally isolate electromagnetic interference generated by devices disposed within the support module (208) from the ambient environment surrounding the second data processing device (106). Intentionally isolating electromagnetic interference means that the structure of a physical structure is adapted to provide such isolation. While many types of physical structures may provide some degree of electromagnetic interference isolation as an inherent consequence of their existence, the electromagnetic interference isolation is not intended. Rather, the physical structures may exist for their other properties such as mechanical strength while providing some degree (albeit low) of electromagnetic interference isolation. Thus, while the support module (208) may to some degree electromagnetically separate devices disposed within the support module (208) from the ambient environment, the support module (208) does not provide electromagnetic interference management services. Providing electromagnetic interference management services may refer to providing at least 20 decibels of attenuation.

In one or more embodiments of the invention, providing electromagnetic interference management services reduces the strength of electromagnetic radiation by at least 20 decibels when the electromagnetic radiation propagates from an internal volume of a data processing device to an ambient environment outside of the data processing device.

The one or more power supplies may supply power to other devices. For example, the power supplies may provide power to electromagnetic interference emitting devices disposed within the payload module (210), other types of devices (e.g., computing device) disposed within the payload module, and/or devices located in other portions of the second data processing device.

The one or more power fans may provide thermal management services to other devices. For example, the fans may regulate the flow of gasses through the second data processing device and, consequently, manage the thermal state of electromagnetic interference emitting devices and/or other types of devices disposed in the payload module (210) and/or the support module (208).

The one or more power networking devices may provide communication services to other devices (e.g., providing network services). For example, the networking devices may manage network interfaces that enables the second data processing device (106) to communicate with other devices (e.g., computing devices that may be controlling the operation of the electromagnetic interference emitting devices).

The one or more computing devices may manage the operations of the other entities of the second data processing device (106). For example, the computing devices may send messages to the electromagnetic interference emitting devices (and/or other types of devices disposed within the payload module or other portions of the second data processing device) to perform predetermined functionality. Such messages, when received by the electromagnetic interference emitting devices may cause the electromagnetic interference emitting devices to stop and/or start emitting electromagnetic interference (and/or perform other actions).

The computing devices may send such instructions when (or around the time when) the electromagnetic interference suppression state of the second data processing device (106) is changed (i.e., when portions of the second data processing device (106) are physically reconfigured). The computing devices may make such determinations based on any number of sensors (not shown) that monitor the physical configuration of the second data processing device (106). The sensors may be disposed, for example, in the payload module, on the vents, or at other locations such that measurements by the sensors indicate the thermal state of components of the second data processing device for which thermal management services (e.g., monitoring the thermal state of components and taking actions such as modifying the rate of gas flow to manage the thermal state of the components) are being provided.

In another example, the computing devices may send messages to fan controllers (not shown) or other devices that manage the operation of gas flow control devices disposed within the second data processing device (106). The computing devices may send such messages based on the thermal state (i.e., temperature) of one or more devices disposed within the second data processing device (106). The computing devices may monitor such thermal states using any number of sensors (not shown) and/or based on messages received from the one or more devices disposed within the second data processing device (106).

In response to receipt of such messages, the fan controllers or other devices may modify the operational state of the gas flow control devices. By doing so, the computing devices may change the thermal state of devices disposed within the second data processing device (106) by controlling the flow of gasses through the second data processing device (106).

Additionally, the computing devices may facilitate diagnosis and remediation of the electromagnetic interference suppression state of the second data processing device. To do so, the computing device may utilize an isolation test system, discussed with respect to FIG. 2.3, to determine the electromagnetic interference suppression state of the second data processing device. Depending on the determined state, the computing devices may perform a corresponding action set to remediate the state of the second data processing device. Remediating the state of the second data processing device may reduce the likelihood of electromagnetic interference propagating out of an internal volume of the second data processing device without being attenuated to an appropriate level for electromagnetic interference isolation purposes.

To manage the operation of the other entities and/or facilitate diagnosis and remediation of electromagnetic interference suppression state of the second data processing device (106), one or more processors of the computing devices may execute instructions (e.g., computer code), stored on a persistent storage, that cause the computing devices to perform all, or a portion, of the method illustrated in FIG. 3. For additional details regarding computing devices, refer to FIG. 5.

To further clarify aspects of embodiments of the invention, a cross section diagram of the second data processing device (106) in accordance with one or more embodiments of the invention is shown in FIG. 2.2. In FIG. 2.2, the cross section is taken along the X-Y plane illustrated in FIG. 2.1.

As seen from FIG. 2.2, the payload module (210) may include an internal volume (214). The internal volume (214) may be used to house devices such as electromagnetic interference emitting devices, supports for such devices, and/or other types of devices that may provide services to the electromagnetic interference emitting devices and/or other devices.

The internal volume (214) may be bounded, on four sides, by portions of the payload module (210). For example, the internal volume (214) may be bounded by a top door (212), a bottom (218), a first side (216), and a second side (not shown). These four components of the payload module (210) may define a rectangular shape of the internal volume (214).

The internal volume (214) may be further bounded, on a fifth and sixth side, by the front vent (200) and the rear vent (204). The front vent (200) and the rear vent (204) may be on opposite sides of the internal volume (214). By doing so, the front vent (200) and the rear vent (204) may define a gas flow path through the payload module (210). For example, gasses may be able to flow from between the two vents through the internal volume (214).

As discussed above, the second data processing device may control gas flows disposed within the second data processing device to provide thermal management services. To do so, the second data processing device may include a thermal management system (220). The thermal management system (220) may include (i) flow control devices, (ii) temperature sensors, and/or (iii) a controller.

The controller may operate the flow control devices based on temperature information (e.g., thermal states) obtained from the temperature sensors and/or temperature information obtained from other devices (e.g., from electromagnetic interference emitting devices). For example, the controller may increase the flow rate of a gas flow disposed within the second data processing devices to manage the temperature of one or more devices within a predetermined range.

The flow control devices may be, for example, fans, actuatable ducting, or other types of active devices for controlling the flow of gasses. The thermal management system (220) may include any number of flow control devices without departing from the invention.

The second data processing device may also include a power system (222). The power system may provide power to any number and/or types of devices disposed within the second data processing device. For example, the power system (222) may provide power to electromagnetic interference emitting devices (and/or other types of devices) disposed within the payload module (210), the thermal management system (220), a communication system (224), and/or computing devices (226).

To do so, the power system (222) may include, for example, one or more power supplies, regulators, controllers, and/or other types of components for providing power. The aforementioned components may identify components to which power is to be supplied, identify a quantity of power to supply to each of the components, and/or provide the power to each of the respective components. As will be discussed in greater detail below, the power system (222) may provide power using an interconnect (230).

The second data processing device may further include a communication system (224). The communication system (224) may provide communication services to devices disposed within the second data processing devices and devices disposed outside of the second data processing devices. To do so, the communication system (224) may support any number of operable connections between the aforementioned devices. The operable connections may utilize any combination of wired and/or wireless networks to facilitate the transmission of data between the aforementioned devices.

Providing communication services may include, for example, exchanging network data units among devices disposed in the payload module, the computing device (226) disposed in the support module (208), and/or other devices disposed outside of the second data processing device. By doing so, the aforementioned devices may communicate with one another via information included in the exchanged network data units. A network data unit may be a communication supported by a communication protocol that enables information to be transmitted. A network data unit may be, for example, a packet in the event that an internet protocol is utilized for transmission of network data units. As will be discussed in greater detail below, the communication system (224) may provide the communication services using an interconnect (230).

The computing device (226) may manage the operation of the components of the second data processing device. For example, the computing device (226) may manage the thermal management system (220), the power system (222), the communication system (224), and/or other components (such as electromagnetic interference emitting devices) disposed within the second data processing device. To manage the other devices, the computing device (226) may use the communication services provided by the communication system (224) as well as the interconnect (230).

The interconnect (230) may be a physical device for providing operable connections between devices disposed within the second data processing device. The interconnect (230) may support distribution of power by the power system (222) to any number of devices disposed within the payload module (210), the support module (208), and/or other locations.

For example, the interconnect (230) may include a set of wires that physically interconnect devices disposed within the second data processing device.

In one or more embodiments of the invention, the interconnect (230) facilitates distribution of power to electromagnetic interference emitting devices disposed within the payload module (210) while the electromagnetic interference emitting devices are isolated. By doing so, the electromagnetic interference emitting devices may be provided power without negatively impacting the operation of other devices due to electromagnetic interference generated by the electromagnetic interference emitting devices.

The interconnect (230) may also facilitate transmission of information between devices disposed in the payload module (210) and the support module (208). For example, the interconnect (230) may include wired connections (e.g., twisted pair, coaxial cabling) that facilitate transmission of information via electrical signals.

To do so, the second data processing device may include a back-plane (232). The back-plane may electromagnetically isolate the interconnect (230) from the internal volume of the payload module (210). For example, the back-plane (232) may be a metal sheet of sufficient thickness to prevent electromagnetic interference (e.g., electromagnetic radiation, local electromagnetic near fields, etc.) from penetrating through the back-plane (232).

The back-plane (232) may include any number of feedthroughs (234). The feedthroughs (234) may be physical devices that enable the interconnect (230) to physically connect to any number of devices disposed within the payload module (210). The feedthroughs (234) may be shielded to electromagnetically isolate the internal volume from the interconnect (230).

As discussed above, additional devices may be disposed in the internal volume (214). To do so, various portions of the second data processing device may be adapted to physically move to enable the additional devices to be inserted into the internal volume (214). However, when physically moving (or for other reasons such as inappropriate use), the various portions of the second data processing device may become deformed or otherwise damaged in a manner that prevents the various portions from limiting the propagation of electromagnetic radiation.

For example, consider a scenario in which the front vent (200) is removable and thereby enables devices to be physically inserted into the internal volume (214) while the front vent (200) is removed. In such a scenario, the front vent (200) may be dropped, bumped, or otherwise subjected to physical force that causes a portion of the front vent (200) to deform. For example, one of the holes (202) may be enlarged due to being subject to physical force. The portion of the front vent (200) that was deformed by the physical force may render the front vent (200) to be unable to attenuate electromagnetic radiation in a frequency range corresponding to a frequency range in which the devices generate electromagnetic interference. Consequently, once the deformed front vent is reattached to the second data processing device, the second data processing device may be unable to provide appropriate levels of electromagnetic interference suppression (e.g., 90 decibels) even though all of the components of the second data processing devices are positioned and oriented with respect to each in a manner that would otherwise cause the second data processing device to provide appropriate level of electromagnetic interference suppression.

To address this and/or other issues, a data processing device in accordance with embodiments of the invention may diagnose its electromagnetic interference suppression state when the physical state (e.g., position and/or orientation of its constituent components) of the data processing device is associated with an electromagnetic interference suppressed state. Additionally, the data processing device may, based on its diagnosed state, take action to remediate its state if the diagnosed state so indicates that remediation may be warranted. For additional details regarding state diagnosis and state remediation, refer to FIGS. 2.3-2.4.

To further clarify the operation of the second data processing device, FIG. 2.3 shows a second cross section diagram in accordance with one or more embodiments of the invention. The second cross section diagram may be similar to that of FIG. 2.2, but includes an isolation test system (240). The isolation test system (240) may be a physical device that may be used to determine an electromagnetic interference suppression state of the second data processing device.

To diagnose the electromagnetic interference suppression state, the isolation test system (240) may be adapted to transmit a first quantity of electromagnetic radiation towards one or more boundaries of the internal volume (214) and determine a second quantity of the transmitted electromagnetic radiation that propagated through the one or more boundaries. A ratio of the first quantity to the second quantity may be used to determine the electromagnetic interference suppression state of the second data processing device. For example, the ratio (or the quantities themselves) may be compared to a predetermined threshold. The outcome of the comparison may indicate the electromagnetic interference suppression state of the second data processing device.

For example, consider a scenario in which the predetermined threshold is a ratio of less than 0.01. To make the determination, the isolation test system (240) may radiate 1 watt of electromagnetic radiation toward a boundary (e.g., the front vent 200, rear vent (204), top, bottom, side, etc.) of the internal volume. The isolation test system (240) may detect that 0.005 watts propagated through the boundary. Based on the aforementioned actions, the ratio may be determined to be 0.005 (0.005/1). Thus, in this scenario, because the ratio meets the threshold (i.e., being less than 0.01), the second data processing device may be determined to be in an electromagnetic interference suppression state (e.g., provides an appropriate level of attenuation of propagating electromagnetic radiation).

To provide the above noted functionality, the isolation test system (240) may include a first portion and a second portion (246). The first portion (244) may be disposed outside of the internal volume of the payload module (210) and the second portion (246) may be disposed inside of the internal volume. The first portion (244) and the second portion (246) may be physically separated by any of the boundaries of the internal volume (e.g., the front vent (200)).

Each of the portions (244, 246) may be physical devices that are adapted to radiate and/or detect electromagnetic radiation. For example, the portions (244, 246) may include wireless transceivers, wireless transmitters, wireless receivers, antennas, and/or other types of components to facilitate radiation and detection of electromagnetic radiation.

The wireless transceivers, transmitters, and/or receivers may be physical devices that generate and/or detect electromagnetic radiation. For example, the wireless transceivers, transmitters, and/or receivers may include signal generators, power amplifiers, and other types of devices for facilitating the radiation of and/or detection of electromagnetic radiation. The wireless transceivers, transmitters, and/or receivers may be any type of such hardware devices without departing from the invention.

The antennas may be physical devices adapted to radiate and pick up electromagnetic radiation. For example, the antennas may be patch antennas, planar inverted F antennas, monopole/dipole antennas, or any other type of antenna. The antennas of each of the portions of the isolation test system (240) may be oriented such that the maximum directivity of the antenna is directed toward a boundary of the internal volume. The antennas of each of the portions may be oriented in other directions without departing from the invention.

In one or more embodiments of the invention, the wireless transceivers, transmitters, receivers, and/or the antennas are adapted to operate in a frequency band that is the same as the frequency band in which electromagnetic interference emitting devices (and/or other devices disposed in the internal volume) are adapted to generate electromagnetic radiation. For example, consider a scenario in which the electromagnetic interference emitting devices are personal electronic devices that emit electromagnetic radiation at 2.4 GHz. In such a scenario, the wireless transceivers, transmitters, receivers, and/or the antennas may be adapted to operate in the 2.4 GHz band.

In one or more embodiments of the invention, the wireless transceivers, transmitters, receivers, and/or the antennas are adapted to operate in a frequency band that is the same as the frequency band in which the second data processing device is adapted to suppress electromagnetic interference. For example, consider a scenario in which the second data processing device is adapted to suppress electromagnetic interference in the frequency range of 900 megahertz to 10 gigahertz. In such a scenario, the wireless transceivers, transmitters, receivers, and/or the antennas may be adapted to operate across the 900 megahertz to 10 GHz band.

While not illustrated in FIG. 2.3, the first portion (244) and/or the second portion (246) may be operably connected to any number of other entities via any combination of wired and/or wireless networks. Thus, the first portion (244) and/or the second portion (246) of the isolation test system (240) may be capable of sending information regarding the radiation of and detection of electromagnetic radiation. In such a scenario, the computing device (226) may coordinate the operation of the aforementioned portions of the first portion (244) and/or the second portion (246) when the computing device (226) provides its functionality and/or performs the method illustrated in FIG. 3.

In other embodiments of the invention, the isolation test system (240) may include a computing device (not shown), separate from the computing device (226), that orchestrates the operation of the portions (244, 246) of the isolation test system (240) when performing the method illustrated in FIG. 3. In such a scenario, the computing device (not shown) may be similar to that illustrated in FIG. 5 and includes instruction stored on persistent storage which when executed by a processor of the computing device causes the computing device to perform the functionality of the isolation test system (240) and/or perform all, or a portion, of the method illustrated in FIG. 3.

The portions (244, 246) of the isolation test system (240) may be adapted to enable remote invocation of their functionality. For example, the portions (244, 246) may be adapted to receive requests for invocation of their functionality and, in response to the requests, perform the requested functionality.

Thus, the isolation test system (240) may be used to monitor the electromagnetic interference suppression state of the second data processing device by utilizing electromagnetic radiation to diagnose the aforementioned state.

To further clarify aspects of embodiments of the invention, FIG. 2.4 shows a third cross section diagram in accordance with one or more embodiments of the invention. The third cross section diagram may be similar to that of FIG. 2.3, but includes electromagnetic interference emitting devices (250) disposed in the internal volume.

As discussed above, the electromagnetic interference emitting devices (250) may radiate electromagnetic radiation as part of their operation. To facilitate determining of the electromagnetic interference suppression state of the second data processing device, the isolation test system (240) and/or the computing device (226) may be adapted to suppress generation of electromagnetic radiation by the electromagnetic interference emitting devices (250) while the electromagnetic interference suppression state of the second data processing device is being determined.

To do so, the aforementioned devices may send messages to the electromagnetic interference emitting devices (250) to suspend (temporarily or indefinitely) radiation of electromagnetic radiation. The electromagnetic interference emitting devices (250) may suspend radiation of electromagnetic radiation in response to the commands. Similarly, the aforementioned devices may send messages to the electromagnetic interference emitting devices (250) to resume radiation of electromagnetic radiation.

For example, to send the messages to the electromagnetic interference emitting devices (250), the isolation test system (240) may be operably connected to the interconnect and, in turn, the electromagnetic interference emitting devices (250). The messages may be sent via any communications protocol without departing from the invention. In some embodiments of the invention, the isolation test system (240) may use communication services provided by the communication system (224) to exchange messages with the electromagnetic interference emitting devices (250).

Thus, the isolation test system (240), the computing device (226), the communication system (224), and/or the electromagnetic interference emitting devices (250) may cooperate to enable the electromagnetic interference suppression state of the second data processing device to be determined. Such cooperation may be coordinated by sending messages among one or more of the aforementioned devices. The messages may include requests for actions to be performed by the receiving devices that facilitate determining of the electromagnetic interference suppression state of the second data processing device.

To provide the above-noted functionality of the isolation test system (240), the isolation test system (240) and/or other components of a data processing device may perform all or a portion of the method illustrated in FIG. 3. The methods illustrated in the aforementioned figures may be used to manage electromagnetic interference.

FIG. 3 shows a flowchart of a method in accordance with one or more embodiments of the invention. The method depicted in FIG. 3 may be used to manage electromagnetic interference in accordance with one or more embodiments of the invention. The method shown in FIG. 3 may be performed completely, or in part, by, for example, data processing devices (e.g., 102, FIG. 1.1). Other components of the system illustrated in FIG. 1.1 may perform all, or a portion, of the method of FIG. 3 without departing from the invention.

While FIG. 3 is illustrated as a series of steps, any of the steps may be omitted, performed in a different order, additional steps may be included, and/or any or all of the steps may be performed in a parallel and/or partially overlapping manner without departing from the invention.

In step 300, a determination that an electromagnetic interference suppression state of the data processing device is to be determined is made.

In one or more embodiments of the invention, the determination is made based on a schedule that specifies one or more points in time in which the electromagnetic interference suppression state of the data processing device is to be determined. The schedule may be a data structure that includes the aforementioned information. The schedule may be stored on a persistent storage operably connected to the computing device and/or an isolation test system.

In one or more embodiments of the invention, the determination is made based on a physical change made to the data processing device. For example, physical change may be opening of a portion of the chassis of the data processing device. The portion of the chassis may bound an internal volume that is adapted to provide electromagnetic interference suppression services to devices disposed within the internal volume.

In one or more embodiments of the invention, the physical change is detected using one or more sensors disposed throughout the data processing device. For example, the sensors may be disposed at locations that enable the sensors to determine the physical state of a corresponding portion of the chassis of the data processing device. The physical state of the corresponding portion may be associated with the ability, or inability, of the internal volume to provide electromagnetic interference suppression services.

For example, the sensors may monitor the physical state of event that bounds the internal volume. To add or remove devices from the internal volume, the event may be moved to enable addition or removal of the devices from the internal volume. The change in the physical state of the portion of the chassis may indicate that a physical change has occurred. Thus, a change in the physical state of a portion of the chassis, or other portions of the data processing device, may indicate a physical change upon which the determination of step 300 may be based.

In step 302, generation of electromagnetic radiation by devices disposed in the internal volume of the data processing device is suppressed in response to the determination of step 300.

In one or more embodiments of the invention, electromagnetic radiation generation is suppressed by sending messages to the devices requesting that generation of electromagnetic radiation be suspended (e.g., delayed, terminated, etc.). In response to receiving the messages, the devices may suspend generation of the electromagnetic radiation.

For example, one or more messages may be sent via interconnect to corresponding devices operably connected to the interconnect. In response to receiving the one or more messages, the devices may suspend one or more activities being performed by the devices that result in the generation of electromagnetic radiation (e.g., electromagnetic interference).

In step 304, while the generation of the electromagnetic radiation is suspended, a quantity of second electromagnetic radiation that is generated by an isolation test system of the data processing device is identified. The quantity of the second electromagnetic radiation is propagated through a boundary of the internal volume.

In one or more embodiments of the invention, the second electromagnetic radiation has a frequency content that matches frequency content of electromagnetic interference generated by the devices disposed in the internal volume of the data processing device.

In one or more embodiments of the invention, the second electromagnetic radiation is generated by a portion of the isolation test system disposed outside of the internal volume.

In one or more embodiments of the invention, the second electromagnetic radiation is generated by a portion of the isolation test system disposed inside of the internal volume.

In one or more embodiments of the invention, a first sub portion of the second electromagnetic radiation is generated by a first portion of the isolation test system disposed outside of the internal volume and a second sub portion of the second electromagnetic radiation is generated by a second portion of the isolation test system disposed inside of the internal volume.

In one or more embodiments of the invention, the quantity of second electromagnetic radiation is identified by a portion of the isolation test system disposed inside of the internal volume.

In one or more embodiments of the invention, the quantity of the second electromagnetic radiation is identified by a portion of the isolation test system disposed outside of the internal volume.

In one or more embodiments of the invention, the boundary of the internal volume corresponds to a portion of the data processing device that is adapted to suppress propagation of the second electromagnetic radiation. For example, the portion of the data processing device may be a vent, the wall, the door, or another physical structure that is adapted to reflect and/or attenuate the second electromagnetic radiation as the second electromagnetic radiation is incident on and/or propagates through the portion of the data processing device.

In step 306, it is determined whether the quantity indicates that the data processing device is an electromagnetic interference suppression compromised state.

In one or more embodiments of the invention, when the data processing device is in the electromagnetic interference suppression compromised state, the internal volume is unable to provide electromagnetic interference suppression services. For example, one of the portions of the data processing device that bounds the internal volume may have been deformed or otherwise modified in a manner that no longer suppresses propagation of electromagnetic radiation.

In one or more embodiments of the invention, when the data processing device is not in the electromagnetic interference suppression compromised state, the internal volume is able to provide electromagnetic interference suppression services. For example, the internal volume may electromagnetically isolate devices disposed within the internal volume from the ambient environment by at least 90 dB or another suitable level of suppression.

In one or more embodiments of the invention, the determination is made by comparing the quantity, or other information such as ratio that is based on the quantity, to a predetermined threshold. If the quantity meets the predetermined threshold, it may be determined that the data processing device is not in the electromagnetic interference suppression compromised state. In contrast, if the quantity does not meet the predetermined threshold, it may be determined that the data processing device is in electromagnetic interference suppression compromised state.

In one or more embodiments of the invention, the predetermined threshold is set empirically. For example, a measurement of the change in magnitude of electromagnetic radiation as it propagates across a boundary of the internal volume may be made while the data processing device is in an electromagnetic interference suppressed state (e.g., not in the electromagnetic interference compromised state). The measurement may be used to determine an appropriate predetermined threshold. Subsequent measurements using an isolation testing system may then be compared to the measurement/predetermined threshold when making the determination of step 306.

If it is determined that the data processing device is in the electromagnetic interference suppression compromised state, the method may proceed to step 308. If it is determined that the data processing device is not in the electromagnetic interference suppression compromised state, the method may proceed to step 310.

In step 308, performance of an action set is initiated to remediate the electromagnetic interference suppression compromised state of the data processing device.

In one or more embodiments of the invention, the action set is a data structure that specifies one or more actions to be performed by one or more portions of the data processing device and/or devices disposed within the data processing device. The action set may be stored on a persistent storage operably connected to the data processing device.

In one or more embodiments of the invention, the action set specifies that the devices are to continue to be suppressed from generating electromagnetic radiation.

In one or more embodiments of the invention, the action set specifies that one or more persons are to be contacted. The contacting may be performed via any method without departing from the invention. For example, the contacting may be performed by sending an electronic mail, a text message, an audio recording, or any other method for contacting a relevant person. The one or more persons may be, for example, administrators that are assigned to manage the data processing device.

In one or more embodiments of the invention, the action set specifies that steps 304 and 306 are to be repeated. For example, by repeating steps 304 and 306 the electromagnetic interference suppression state of the data processing device may be verified.

In one or more embodiments of the invention, the action set is performed by sending messages to components (e.g., isolation test system, communication system, computing device, etc.) of the data processing device and/or other devices that are to perform actions of the action set. In response, the components of the data processing device and/or the other devices may perform the actions specified in the messages. The messages may be sent using the interconnect as discussed with respect to step 302.

In one or more embodiments of the invention, the action set is performed by initiating performance of a communication sequence. The communication sequence may be a pattern of light, or other type of stimuli (e.g., auditory), that communicates information to a user. The communication sequence may provide the user with information regarding the state of the data processing device (e.g., an electromagnetic interference suppression compromised state.).

In one or more embodiments of the invention, remediating the electromagnetic interference suppression compromised state of the data processing device causes the data processing device to enter into an electromagnetic interference suppressed state. For example, remediating the electromagnetic interference suppression compromised state may cause a portion of the data processing device to be modified in a manner that enables the internal volume to provide electromagnetic interference suppression services.

The method may end following step 308.

Returning to step 306, the method may proceed to step 310 following step 306 if the data processing device is not in the electromagnetic interference suppression compromised state.

In step 310, the suppressing of the generation of the electromagnetic radiation by the devices is stopped.

In one or more embodiments of the invention, the suppression of the generation of electromagnetic radiation by the devices is stopped by sending one or more messages to the devices indicating that the devices may generate and/or radiate electromagnetic radiation. In response, the devices may resume generation and/or radiation of electromagnetic radiation.

The method may end following step 310.

Thus, via the method illustrated in FIG. 3, one or more embodiments of the invention may facilitate management of electromagnetic interference by proactively identifying whether it is likely that electromagnetic interference may propagate outside of data processing devices without being significantly attenuated.

To further clarify aspects of embodiments of the invention, a nonlimiting example is provided in FIGS. 4.1-4.5. FIGS. 4.1-4.5 show cross section diagrams of an example data processing device, similar to that illustrated in FIG. 2.4, at different points in time.

EXAMPLE

Consider a scenario as illustrated in FIG. 4.1 in which a data processing device houses electromagnetic interference emitting devices (250) and an internal volume that provides electromagnetic interference suppression services to the electromagnetic interference emitting devices (250).

While disposed in the data processing device, electromagnetic interference emitting devices (250) emit electromagnetic radiation (400) which the internal volume of the data processing device is adapted to suppress. Specifically, the internal volume is adapted to suppress propagation of the electromagnetic radiation (400) outside of the internal volume.

To monitor the electromagnetic interference suppression state of the data processing device, the data processing device includes an isolation test system (240). The isolation test system (240) includes a first portion (244) disposed outside of the internal volume and a second portion (246) disposed inside of the internal volume.

At a first point in time, it is determined that the electromagnetic interference suppression state of the data processing device is to be determined. In response to the determination, the isolation test system (240) suppresses generation of the electromagnetic radiation (400) as illustrated in FIG. 4.2.

While generating the electromagnetic radiation (400), the first portion (244) radiates second electromagnetic radiation (402). As seen from FIG. 4.2, the second electromagnetic radiation (402) is unable to propagate through the boundary of the internal volume. Consequently, when the second portion (246) attempts to determine a quantity of the second electromagnetic radiation (402) that has propagated through the boundary, the second portion (246) determines that the quantity is 0.

Based on the determination that the quantity is zero, isolation test system (240) determines that the data processing device is in an electromagnetic interference suppressed state and, consequently, stops suppression of the electromagnetic radiation (400) as illustrated in FIG. 4.3.

At a second point in time, the user of the data processing device determines that one of the electromagnetic interference emitting devices (250) should be swapped out for a new electromagnetic interference emitting device. To do so, the user removes the front vent (200) to gain access to the electromagnetic interference emitting devices (250).

While the front vent (200) is removed, it is inadvertently dropped onto a hard surface which results in the formations of the front vent (200) as illustrated in FIG. 4.4. Due to the deformations (410), when the front vent (200) is reattached to the data processing device, the internal volume of the data processing device is no longer electromagnetically isolated.

For example, the structure of the front vent (200) may control whether or not electromagnetic radiation may propagate through the front vent (200) with or without being attenuated by significant degree. Thus, the deformations (410) of the front vent (200) may enable electromagnetic radiation generated by the electromagnetic interference emitting devices (250) to propagate out of the internal volume through the front vent (200) without being significantly attenuated.

After the front vent (200) is reattached, isolation test system (240) determines that an electromagnetic interference suppression state is to be determined. Isolation test system (240) makes the aforementioned determination based on the physical change of the location of the front vent (200) when it is removed and reattached. The isolation test system (240) makes the aforementioned determination using sensor data obtained from sensors (not shown) that monitor the physical location of the front vent (200).

In response to the determination, the first portion (244) of the isolation test system (240) begins generation and radiation of the second electromagnetic radiation (402) as illustrated in FIG. 4.5. However, due to the deformations (410) in the front vent (200), the second electromagnetic radiation (402) is able to propagate through the boundary of the internal volume. Thus, when the second portion (246) determines the quantity of the second electromagnetic radiation (402), the second portion (246) identifies that the quantity is of significant magnitude. Consequently, the isolation test system (240) determines that the data processing device is in electromagnetic interference suppression compromised state.

In response to determining that the data processing device is in an electromagnetic interference suppression compromised state, the isolation test system (240) performs an action set to remediate electromagnetic interference suppression compromised state. The action set includes continuing suppression of generation and/or radiation of electromagnetic radiation by the electromagnetic interference emitting devices (250). The action set also includes sending an electronic mail to the user indicating that the data processing device is in the electromagnetic interference suppression compromised state.

End of Example

Thus, as illustrated in FIGS. 4.1-4.5, the system of FIG. 1.1 may proactively monitor the electromagnetic interference suppression states of the data processing devices and take appropriate action in the event that electromagnetic interference suppression states are compromised states.

Figure 5:
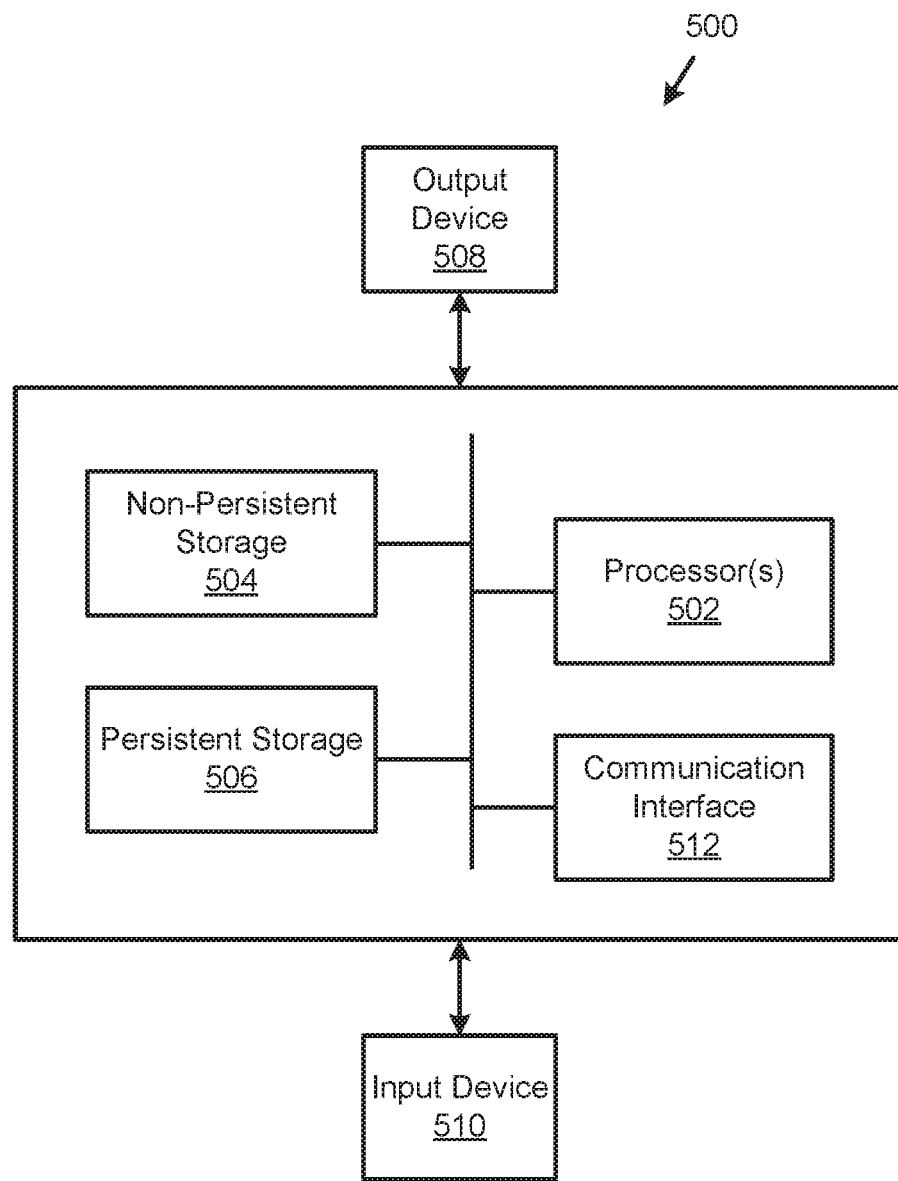
FIG. 5 shows a diagram of a computing device in accordance with one or more embodiments of the invention.

As discussed above, embodiments of the invention may be implemented using computing devices. FIG. 5 shows a diagram of a computing device in accordance with one or more embodiments of the invention. The computing device (500) may include one or more computer processors (502), non-persistent storage (504) (e.g., volatile memory, such as random access memory (RAM), cache memory), persistent storage (506) (e.g., a hard disk, an optical drive such as a compact disk (CD) drive or digital versatile disk (DVD) drive, a flash memory, etc.), a communication interface (512) (e.g., Bluetooth interface, infrared interface, network interface, optical interface, etc.), input devices (510), output devices (508), and numerous other elements (not shown) and functionalities. Each of these components is described below.

In one embodiment of the invention, the computer processor(s) (502) may be an integrated circuit for processing instructions. For example, the computer processor(s) may be one or more cores or micro-cores of a processor. The computing device (500) may also include one or more input devices (510), such as a touchscreen, keyboard, mouse, microphone, touchpad, electronic pen, or any other type of input device. Further, the communication interface (512) may include an integrated circuit for connecting the computing device (500) to a network (not shown) (e.g., a local area network (LAN), a wide area network (WAN) such as the Internet, mobile network, or any other type of network) and/or to another device, such as another computing device.

In one embodiment of the invention, the computing device (500) may include one or more output devices (508), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (502), non-persistent storage (504), and persistent storage (506). Many different types of computing devices exist, and the aforementioned input and output device(s) may take other forms.

Embodiments of the invention may provide a method, system, and device for managing electromagnetic interference. A system in accordance with embodiments of the invention may manage electromagnetic interference at a data processing device level. That is, such devices may include functionality to limit the propagation of electromagnetic interference from within data processing devices to an ambient environment surrounding the data processing device. By doing so, such data processing devices may be used in a high-density environment without negatively impacting the functionality of the high-density environment.

A data processing device in accordance with embodiments of the invention may monitor its ability to suppress electromagnetic interference and take action if it determines that it is unable to suppress electromagnetic interference. To do so, the data processing device may include an isolation test system that operates in a frequency range over which the data processing device is adapted to suppress electromagnetic interference. By doing so, the data processing device may proactively monitor its electromagnetic interference suppression state to prevent the inadvertent emission of electromagnetic interference.

Thus, embodiments of the invention may address the problem electromagnetic interference within a high-density environment. Specifically, embodiments of the invention may provide a data processing device level solution that proactively monitors the ability of data processing devices to suppress electromagnetic interference to reduce the likelihood of inadvertent emission of electromagnetic interference.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the data management device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A data processing device, comprising:
   an internal volume for housing devices; and
   an isolation test system programmed to:
      make a determination that an electromagnetic interference suppression state of the data processing device is to be determined;
      in response to the determination:
         suppress generation of electromagnetic radiation by the devices;
         while the generation of the electromagnetic radiation by the devices is suppressed:
            identify a quantity of second electromagnetic radiation that propagated through a boundary of the internal volume;
            make a second determination, based at least in part on the quantity, that the electromagnetic interference suppression state of the data processing device is an electromagnetic interference suppression compromised state; and
            initiate performance of an action set to remediate the electromagnetic interference suppression compromised state of the data processing device based on the second determination.

2. The data processing device of claim 1, wherein the isolation test system comprises:
   a first portion disposed outside of the internal volume; and
   a second portion disposed inside of the internal volume.

3. The data processing device of claim 2, wherein the second electromagnetic radiation is generated by the first portion.

4. The data processing device of claim 2, wherein the second electromagnetic radiation is generated by the second portion.

5. The data processing device of claim 2, wherein the second electromagnetic radiation is generated by the first portion and the second portion.

6. The data processing device of claim 1, wherein the second electromagnetic radiation has a frequency content corresponding to a frequency range in which the data processing device is adapted to suppress propagation of the electromagnetic radiation.

7. The data processing device of claim 1, wherein the determination is made based upon a schedule that specifies one or more points in time during when the electromagnetic interference suppression state of the data processing device is scheduled to be tested.

8. The data processing device of claim 1, wherein the determination is made based upon a physical change in a structure of the data processing device.

9. The data processing device of claim 8, wherein the physical change is movement of a vent of the data processing device.

10. The data processing device of claim 9, wherein the vent is adapted to suppress propagation of the electromagnetic radiation.

11. The data processing device of claim 8, wherein the physical change is movement of a portion of the data processing device to facilitate modification of a device of the devices.

12. The data processing device of claim 1, wherein the isolation test system is further programmed to:
   make a third determination that the electromagnetic interference suppression state of the data processing device is to be determined;
   in response to the third determination:
      suppress second generation of the electromagnetic radiation by the devices;
      while the second generation of the electromagnetic radiation by the devices is suppressed:
         identify a second quantity of the second electromagnetic radiation that propagated through the boundary of the internal volume;
         make a fourth determination, based at least in part on the second quantity, that the electromagnetic interference suppression state of the data processing device is an electromagnetic interference suppressed state; and
         stop the suppressing of the second generation of the electromagnetic radiation by the devices based on the fourth determination.

13. The data processing device of claim 1, wherein the data processing device is adapted to attenuate the electromagnetic radiation as the electromagnetic radiation propagates through the boundary of the internal volume by at least 90 decibels when the electromagnetic interference suppression state of the data processing device is an electromagnetic interference suppressed state.

14. The data processing device of claim 13, wherein the data processing device is further adapted to not attenuate the electromagnetic radiation as the electromagnetic radiation propagates through the boundary of the internal volume by at least 90 decibels when the electromagnetic interference suppression state of the data processing device is the electromagnetic interference suppression compromised state.

15. The data processing device of claim 1, wherein at least a device of the devices is an electromagnetic interference emitting device.

16. The data processing device of claim 1, wherein at least a device of the devices is a cell phone.

17. A method for managing electromagnetic interference (EMI), comprising:
   making a determination that an EMI suppression state of a data processing device is to be determined;
   in response to the determination:
      suppressing generation of electromagnetic radiation by devices disposed in the data processing device;
      while the generation of the electromagnetic radiation by the devices is suppressed:
         identifying a quantity of second electromagnetic radiation that propagated through a boundary of an internal volume of the data processing device;
         making a second determination, based at least in part on the quantity, that the EMI suppression state of the data processing device is an electromagnetic interference suppression compromised state; and
         initiating performance of an action set to remediate the electromagnetic interference suppression compromised state of the data processing device based on the second determination.

18. The method of claim 17, further comprising:
   making a third determination that the electromagnetic interference suppression state of the data processing device is to be determined;
   in response to the third determination:
      suppressing second generation of the electromagnetic radiation by the devices;

while the second generation of the electromagnetic radiation by the devices is suppressed:
identifying a second quantity of the second electromagnetic radiation that propagated through the boundary of the internal volume;
making a fourth determination, based at least in part on the second quantity, that the electromagnetic interference suppression state of the data processing device is an electromagnetic interference suppressed state; and
stopping the suppressing of the second generation of the electromagnetic radiation by the devices based on the fourth determination.

19. A non-transitory computer readable medium comprising instructions that when executed by a data processing device cause the data processing device to perform a method for managing electromagnetic interference (EMI), the method comprising:
making a determination that an EMI suppression state of a data processing device is to be determined;
in response to the determination:
suppressing generation of electromagnetic radiation by devices disposed in the data processing device;
while the generation of the electromagnetic radiation by the devices is suppressed:
identifying a quantity of second electromagnetic radiation that propagated through a boundary of an internal volume of the data processing device;
making a second determination, based at least in part on the quantity, that the EMI suppression state of the data processing device is an electromagnetic interference suppression compromised state; and
initiating performance of an action set to remediate the electromagnetic interference suppression compromised state of the data processing device based on the second determination.

20. The non-transitory computer readable medium of claim 19, wherein the method further comprises:
making a third determination that the electromagnetic interference suppression state of the data processing device is to be determined;
in response to the third determination:
suppressing second generation of the electromagnetic radiation by the devices;
while the second generation of the electromagnetic radiation by the devices is suppressed:
identifying a second quantity of the second electromagnetic radiation that propagated through the boundary of the internal volume;
making a fourth determination, based at least in part on the second quantity, that the electromagnetic interference suppression state of the data processing device is an electromagnetic interference suppressed state; and
stopping the suppressing of the second generation of the electromagnetic radiation by the devices based on the fourth determination.

\* \* \* \* \*